(12) United States Patent
Matsumoto

(10) Patent No.: US 12,213,244 B2
(45) Date of Patent: Jan. 28, 2025

(54) TRANSMISSION MODULE, ELECTRONIC UNIT, AND ELECTRONIC DEVICE

(71) Applicant: CANON KABUSHIKI KAISHA, Tokyo (JP)

(72) Inventor: Shoji Matsumoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 205 days.

(21) Appl. No.: 18/047,354

(22) Filed: Oct. 18, 2022

(65) Prior Publication Data

US 2023/0133827 A1     May 4, 2023

(30) Foreign Application Priority Data

Nov. 1, 2021   (JP) ................. 2021-178495

(51) Int. Cl.
*H05K 1/02*       (2006.01)
*H04N 23/50*    (2023.01)
*H05K 1/18*       (2006.01)

(52) U.S. Cl.
CPC .......... *H05K 1/025* (2013.01); *H05K 1/0281* (2013.01); *H04N 23/50* (2023.01); *H05K 1/0245* (2013.01); *H05K 1/189* (2013.01); *H05K 2201/09236* (2013.01); *H05K 2201/09409* (2013.01); *H05K 2201/09727* (2013.01); *H05K 2201/10189* (2013.01); *H05K 2201/2009* (2013.01)

(58) Field of Classification Search
CPC ................. H05K 1/025; H05K 1/0281; H05K 2201/09236; H05K 2201/09409; H04N 23/50

USPC ......................................................... 361/749
See application file for complete search history.

(56) References Cited

U.S. PATENT DOCUMENTS

| | | |
|---|---|---|
| 7,564,695 B2 | 7/2009 | Matsumoto |
| 7,595,546 B2 | 9/2009 | Matsumoto |
| 8,428,155 B2 | 4/2013 | Matsumoto |
| 9,192,044 B2 | 11/2015 | Hayashi |
| 10,306,761 B2 | 5/2019 | Numagi |
| 10,716,211 B2 | 7/2020 | Numagi |
| 11,019,719 B2 | 5/2021 | Matsumoto |

(Continued)

FOREIGN PATENT DOCUMENTS

| | | |
|---|---|---|
| JP | 2009-135285 A | 6/2009 |
| JP | 2013-172128 A | 9/2013 |

(Continued)

*Primary Examiner* — Andargie M Aychillhum
(74) *Attorney, Agent, or Firm* — VENABLE LLP

(57) ABSTRACT

A transmission module includes a flexible printed wiring board including a signal line, a connector mounted on the flexible printed wiring board, and a reinforcing member disposed at a position opposing the connector with the flexible printed wiring board therebetween. The signal line includes a pad connected to a terminal of the connector. The reinforcing member includes a first portion disposed in a region including at least part of the pad as viewed in a direction perpendicular to a main surface of the flexible printed wiring board, and a second portion disposed around the first portion as viewed in the direction perpendicular to the main surface. A member constituting the first portion is a member having a nature that reduces a characteristic impedance of the pad more than a member constituting the second portion does.

17 Claims, 16 Drawing Sheets

(56) References Cited

U.S. PATENT DOCUMENTS

| | | | |
|---|---|---|---|
| 11,043,525 B2 | 6/2021 | Matsumoto | |
| 2004/0080386 A1 | 4/2004 | Kitamura | |
| 2006/0164817 A1* | 7/2006 | Yoshida | H01L 31/02325 |
| | | | 257/E31.127 |
| 2012/0274423 A1 | 11/2012 | Kato | |
| 2016/0064793 A1 | 3/2016 | Yosui | |
| 2017/0358847 A1* | 12/2017 | Cho | H01R 12/79 |
| 2020/0214130 A1 | 7/2020 | Kawamura | |
| 2021/0273010 A1 | 9/2021 | Matsumoto | |

FOREIGN PATENT DOCUMENTS

| | | |
|---|---|---|
| WO | 2018/042793 A1 | 3/2018 |
| WO | 2019/220836 A1 | 11/2019 |

\* cited by examiner

TRANSMISSION MODULE, ELECTRONIC UNIT, AND ELECTRONIC DEVICE

BACKGROUND OF THE INVENTION

Field of the Invention

The present disclosure relates to a technique of transmitting a digital signal.

Description of the Related Art

An electronic device includes an electronic unit including a transmission module and two electronic modules that communicate data in the form of a digital signal via the transmission module. Since flexibility is required for the transmission module in the case where the electronic unit is disposed in a casing of an electronic device, a flexible printed wiring board is used for the transmission module. The flexible printed wiring board and a rigid printed wiring board of each electronic module are interconnected via a connector. That is, a connector on the flexible printed wiring board is attached to a connector on the rigid printed wiring board. The flexible printed wiring board of this kind has less strength than the rigid printed wiring board. Therefore, Japanese Patent Laid-Open No. 2009-135285 discloses a configuration in which a reinforcing member is disposed at a position opposing a connector with the flexible printed wiring board therebetween.

Incidentally, there is an increasing tendency in the transmission speed of the digital signal transmitted via the flexible printed wiring board. Accompanied by the increase in the transmission speed, reflection of the digital signal in the signal line of the flexible printed wiring board that has not been an issue has come to affect the quality of the digital signal more.

SUMMARY OF THE INVENTION

According to one aspect of the present invention, a transmission module includes a flexible printed wiring board including a signal line, a connector mounted on the flexible printed wiring board, and a reinforcing member disposed at a position opposing the connector with the flexible printed wiring board therebetween. The signal line includes a pad connected to a terminal of the connector. The reinforcing member includes a first portion disposed in a region including at least part of the pad as viewed in a direction perpendicular to a main surface of the flexible printed wiring board, and a second portion disposed around the first portion as viewed in the direction perpendicular to the main surface. A member constituting the first portion is a member having a nature that reduces a characteristic impedance of the pad more than a member constituting the second portion does.

Further features of the present invention will become apparent from the following description of exemplary embodiments with reference to the attached drawings.

DESCRIPTION OF THE EMBODIMENTS

Embodiments of the present disclosure will be described in detail below with reference to drawings.

First Embodiment

Figure 1:
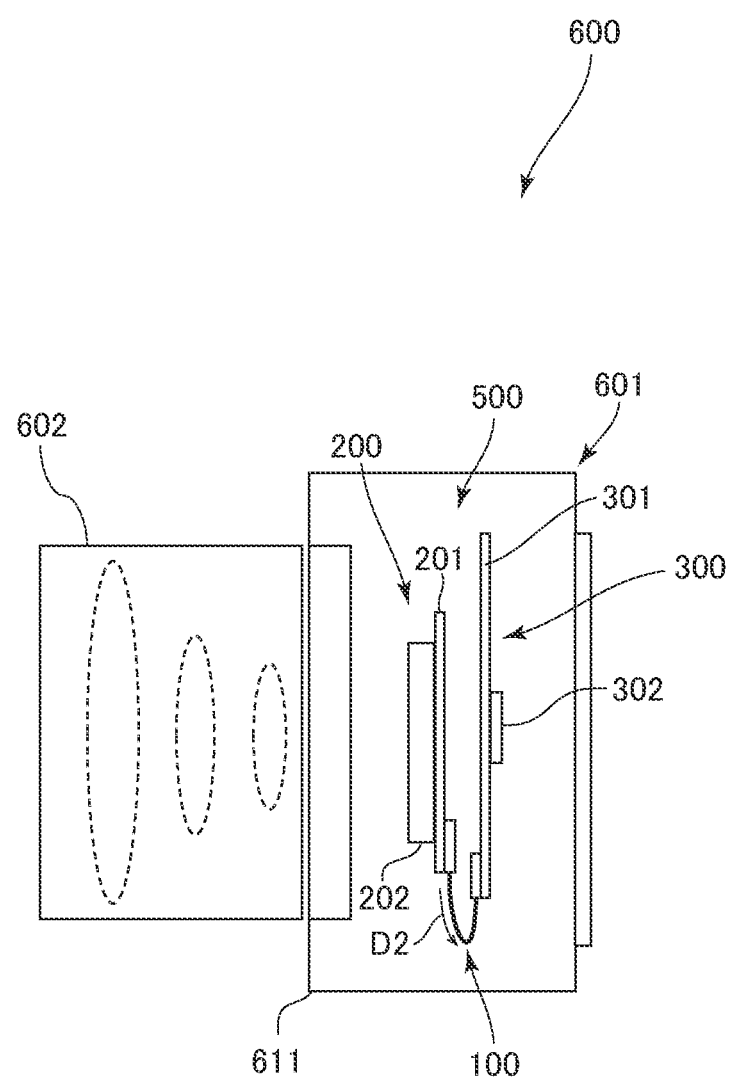
FIG. 1 is an explanatory diagram of a digital camera serving as an example of an electronic device according to a first embodiment.

FIG. 1 is an explanatory diagram of a digital camera 600 that is an image pickup apparatus serving as an example of an electronic device according to a first embodiment. The digital camera 600 that is an image pickup apparatus is a digital camera of a lens-replacing type, and includes a camera body 601. A lens unit (lens barrel) 602 including a lens is attachable to and detachable from the camera body 601. The camera body 601 includes a casing 611, and an electronic unit 500 disposed inside the casing 611.

The electronic unit 500 includes an image pickup module 200 serving as an example of a first electronic module, an image processing module 300 serving as an example of a second electronic module, and a transmission module 100. The image pickup module 200 transmits a digital signal D2 indicating an image signal to the image processing module 300 via the transmission module 100. The image pickup module 200 transmits the digital signal D2 to the image processing module 300 via the transmission module 100 by multilevel transmission of 3 or more levels, which is 4-level transmission in the first embodiment. As a result of this, the transmission speed of data can be increased.

Figure 2A:
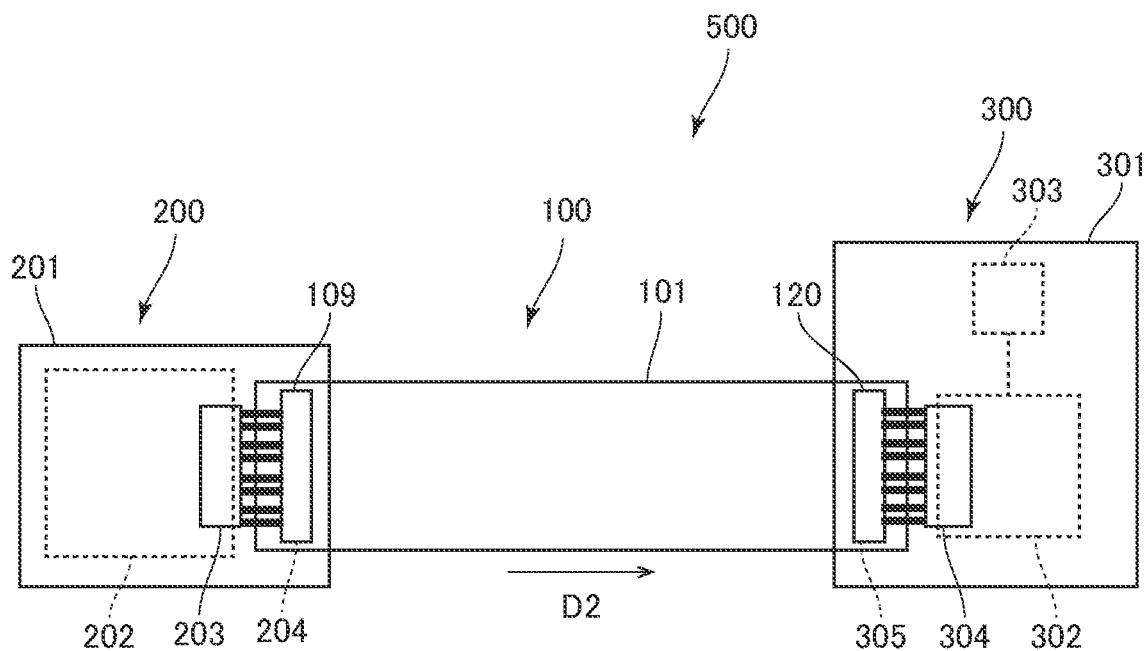
FIG. 2A is an explanatory diagram of an electronic unit according to a first embodiment.
Figure 2B:
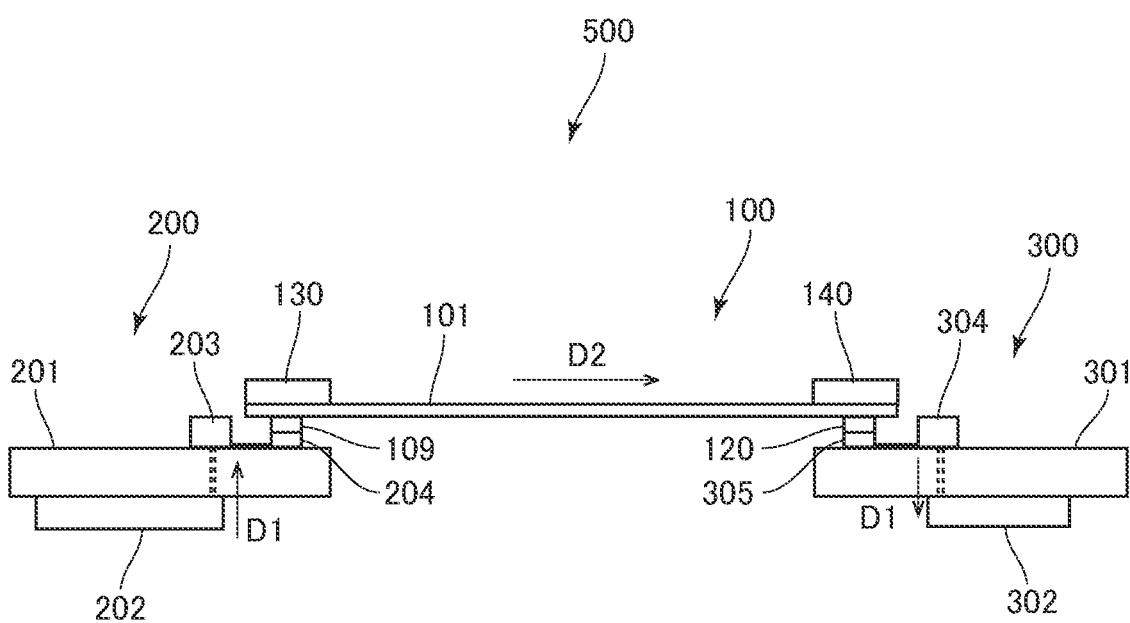
FIG. 2B is an explanatory diagram of the electronic unit according to the first embodiment.

FIGS. 2A and 2B are explanatory diagrams of an electronic unit 500 according to the first embodiment. FIG. 2A is a schematic plan view of the electronic unit 500, and FIG. 2B is a schematic side view of the electronic unit 500. In FIGS. 2A and 2B, the transmission module 100 is stretched straight.

The image pickup module 200 serves as an example of a printed circuit board, and also serves as an example of a semiconductor module. The image pickup module 200 includes a printed wiring board 201, an image sensor 202 serving as an example of a semiconductor device, a conversion circuit 203 serving as an example of a semiconductor device, and a connector 204.

The printed wiring board 201 is a rigid printed wiring board. The image sensor 202, the conversion circuit 203, and the connector 204 are mounted on the printed wiring board 201.

The image sensor 202 is, for example, a complementary metal oxide semiconductor CMOS image sensor, or a charge coupled device: CCD image sensor. The image sensor 202 includes a circuit that converts light incident via the lens unit 602 into an analog signal that is an electric signal, and a circuit that converts the analog signal into a digital signal D1. As a result of this, the image sensor 202 outputs a digital signal D1. The digital signal D1 is an image signal. In the first embodiment, the digital signal D1 is a binary signal.

The conversion circuit 203 converts the digital signal D1 that is a binary signal to a multilevel signal, which is the digital signal D2 that is a 4-level signal in the first embodiment. As described above, the conversion circuit 203 modulates the digital signal D1 that is a binary signal to the digital signal D2 that is a 4-level signal, and outputs the digital signal D2 to the connector 204 subsequent thereto.

The connector 204 is an interface through which the digital signal D2 is output from the conversion circuit 203 to the transmission module 100, and is electrically connected to the conversion circuit 203.

To be noted, although a case where the conversion circuit 203 is constituted by a semiconductor device different from the image sensor 202 has been described, the configuration is not limited to this, and the image sensor 202 may be configured to output the digital signal D2 that is a 4-level signal as an image signal. For example, the conversion circuit 203 may be included in the image sensor 202.

The image processing module 300 serves as an example of a printed circuit board, and also serves as an example of a semiconductor module. The image processing module 300 includes a printed wiring board 301, and as examples of semiconductor devices, an image processing device 302, a memory device 303, and a conversion circuit 304.

The printed wiring board 301 is a rigid printed wiring board. The image processing device 302, the memory device 303, and the conversion circuit 304 are mounted on the printed wiring board 301.

A connector 305 is an interface through which input of the digital signal D2 from the transmission module 100 is received, and is electrically connected to the conversion circuit 304 subsequent thereto. In the first embodiment, the connector 305 has substantially the same configuration as the connector 204.

The conversion circuit 304 converts the digital signal D2 that is a 4-level signal into the digital signal D1 that is a binary signal, and outputs the digital signal D1 to the image processing device 302. That is, the conversion circuit 304 demodulates the digital signal D2 that is a 4-level signal into the digital signal D1 that is a binary signal.

The image processing device 302 is, for example, a digital signal processor, obtains the digital signal D1, and performs correction processing on the digital signal D1 to generate image data. The memory device 303 stores the image data.

To be noted, although a case where the conversion circuit 304 is constituted by a semiconductor device different from the image processing device 302 has been described, the configuration is not limited to this, and the conversion circuit 304 may be included in the image processing device 302. That is, the image processing device 302 may be configured to obtain the digital signal D2 that is a 4-level signal.

The transmission module 100 is an example of a flexible printed circuit board. The transmission module 100 is used for transmitting the digital signal D2 from the image pickup module 200 to the image processing module 300. The digital signal D2 is preferably a differential signal that enables high-speed transmission.

The transmission module 100 includes a flexible printed wiring board 101, and connectors 109 and 120 mounted on the flexible printed wiring board 101. The connectors 109 and 120 are each electrically connected to the flexible printed wiring board 101. The connector 109 is detachably attached to the connector 204, and the connector 120 is detachably attached to the connector 305. The connector 109 is electrically connected to the connector 204 when attached to the connector 204. In addition, the connector 120 is electrically connected to the connector 305 when attached to the connector 305. In the first embodiment, the connector 120 has substantially the same configuration as the connector 109.

As a result of the configuration described above, the image sensor 202 is capable of communicating data with the image processing device 302 via the conversion circuit 203, the connector 204, the connector 109, the flexible printed wiring board 101, the connector 120, the connector 305, and the conversion circuit 304.

Figure 3:
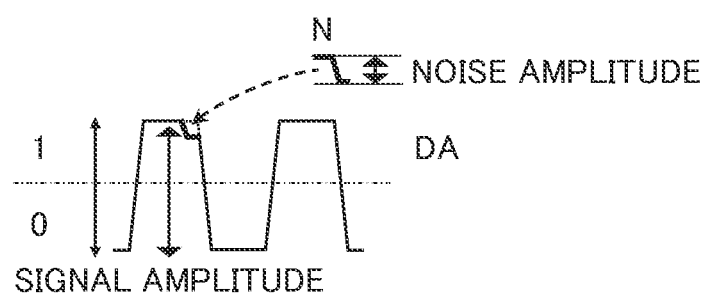
FIG. 3 is an explanatory diagram of comparison between two digital signals.
Figure 3:
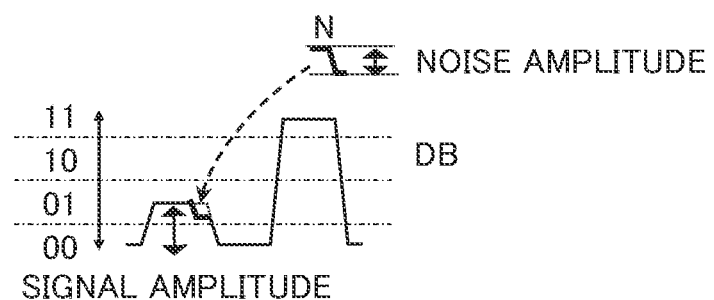

Here, in the case of transmitting a digital signal by multilevel transmission, the transmission speed is improved but the S/N ratio to the noise of the same voltage amplitude becomes low as compared with a case of transmitting a digital signal by binary transmission. FIG. 3 is an explanatory diagram comparing a case where a digital signal DA is transmitted by binary transmission and a case where a digital signal DB is transmitted by 4-level transmission. The maximum voltage amplitudes of the digital signals DA and DB are set to be equal. In addition, the voltage amplitudes of a noise N superimposed on the digital signals DA and DB are also set to be equal. Even in the case where the noise N of the same amplitude is superimposed on the digital signals DA and DB, the S/N ratio of the digital signal DB that is a 4-level signal is lower than the S/N ratio of the digital signal DA that is a binary signal. One cause of the noise N is inconsistency of a characteristic impedance. When there is inconsistency of the characteristic impedance, a reflection wave of the signal is generated as the noise N at an inconsistent portion.

Figure 4A:
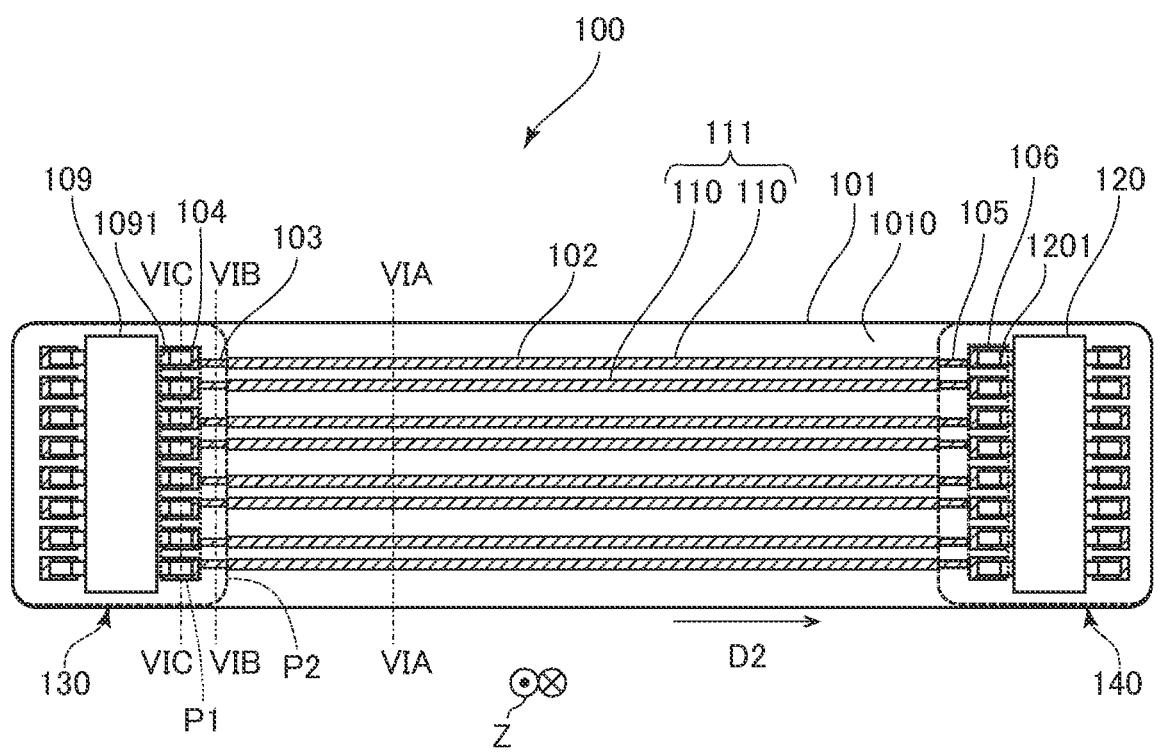
FIG. 4A is a plan view of a transmission module according to the first embodiment.
Figure 4B:
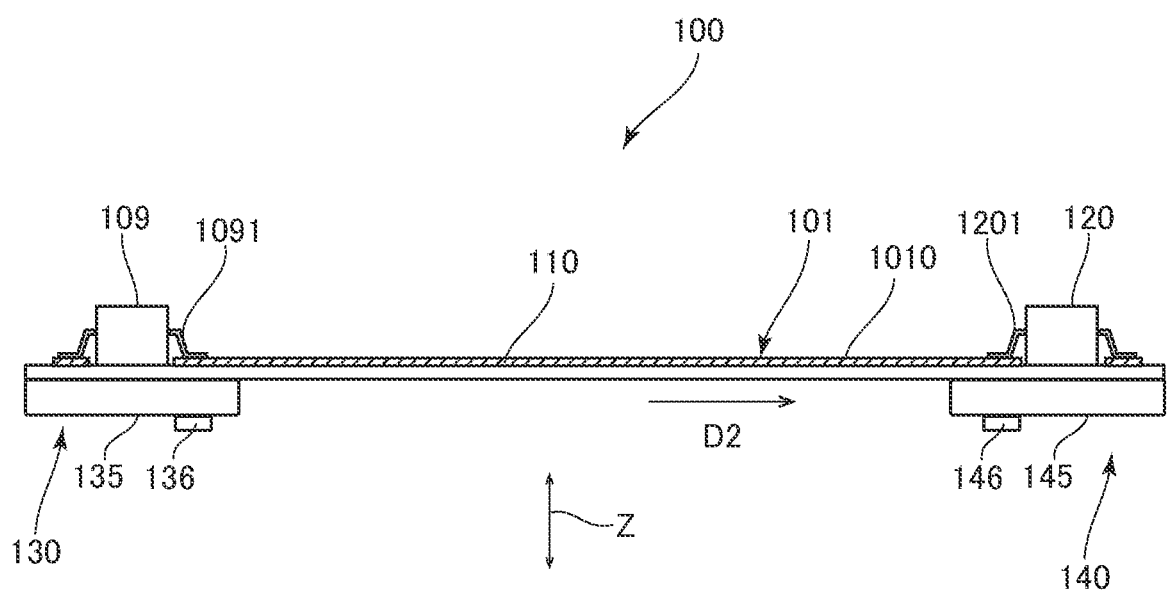
FIG. 4B is a longitudinal section view of the transmission module according to the first embodiment.

FIG. 4A is a plan view of the transmission module 100 according to the first embodiment. FIG. 4B is a longitudinal section view of the transmission module 100 according to the first embodiment. FIGS. 4A and 4B schematically illustrate the transmission module 100. To be noted, in FIGS. 4A and 4B, the flexible printed wiring board 101 is stretched straight.

The flexible printed wiring board 101 includes a plurality of signal lines 110 used for transmission of the digital signal D2. Further, the flexible printed wiring board 101 may include lines other than the signal line 110 such as a control line, a power line, and a ground line. Among the plurality of signal lines 110, pairs of adjacent signal lines 110 each constitute a differential line pair 111 that is a transmission path used for transmitting a differential signal. In the example of FIG. 4A, eight signal lines 110 constitute four differential line pairs 111. Due to increase in the size of the image data, the digital signal D2 is transmitted at a transmission speed of 10 Gbps or more per one differential line pair 111. Gbps stands for giga bits per second. The signal lines 110 are each formed from a metal foil such as a copper foil.

Figure 5A:
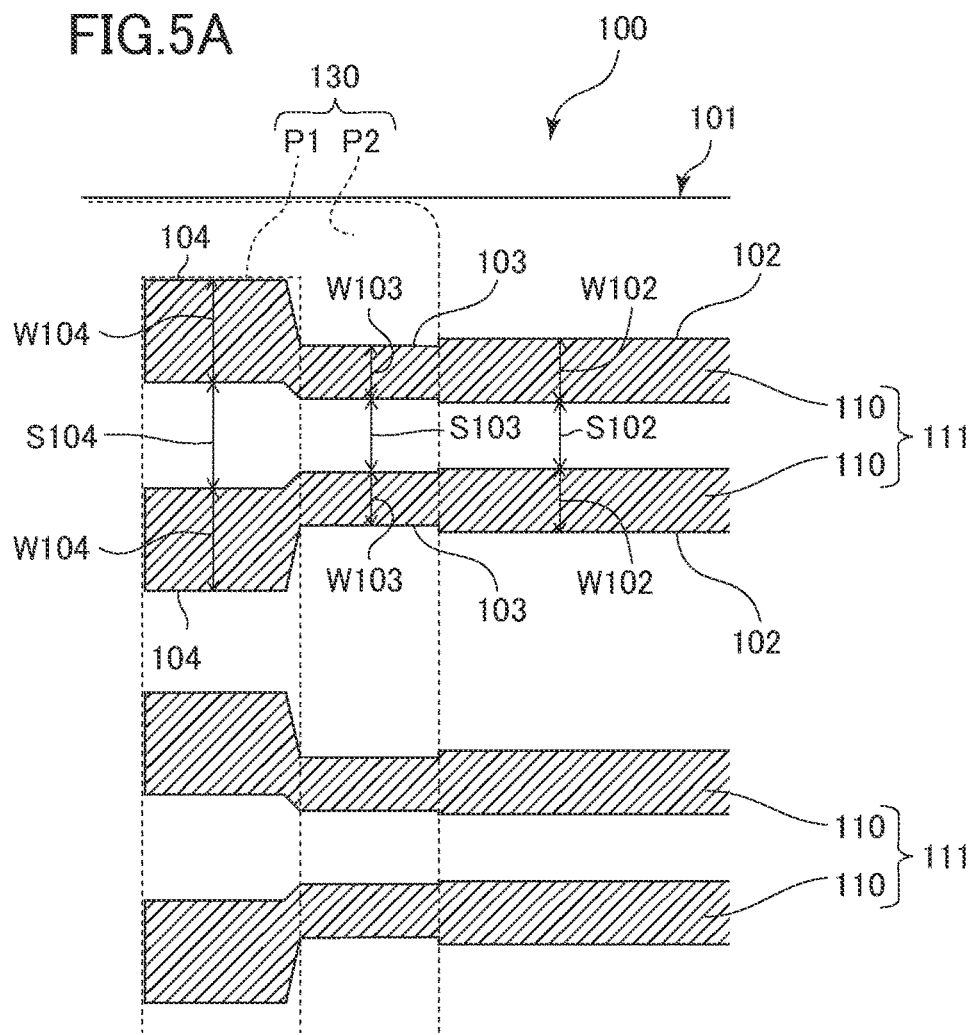
FIG. 5A is a partial plan view of the transmission module according to the first embodiment.
Figure 5B:
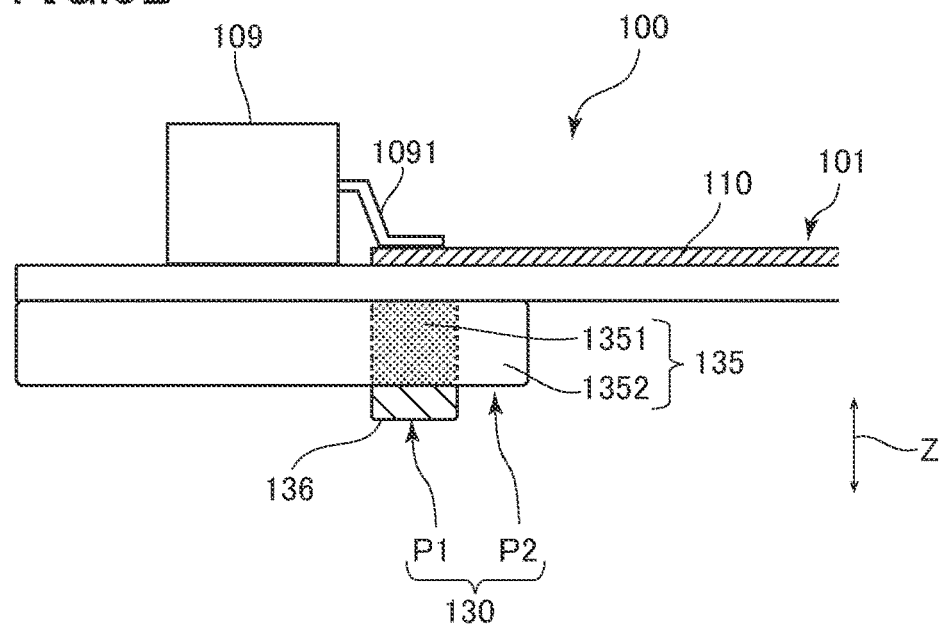
FIG. 5B is a partial section view of the transmission module according to the first embodiment.
Figure 6A:
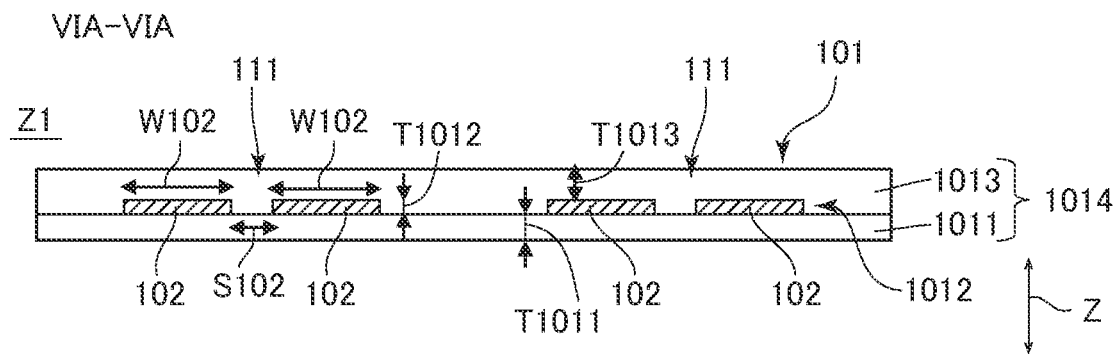
FIG. 6A is a cross-section view of the transmission module according to the first embodiment.
Figure 6B:
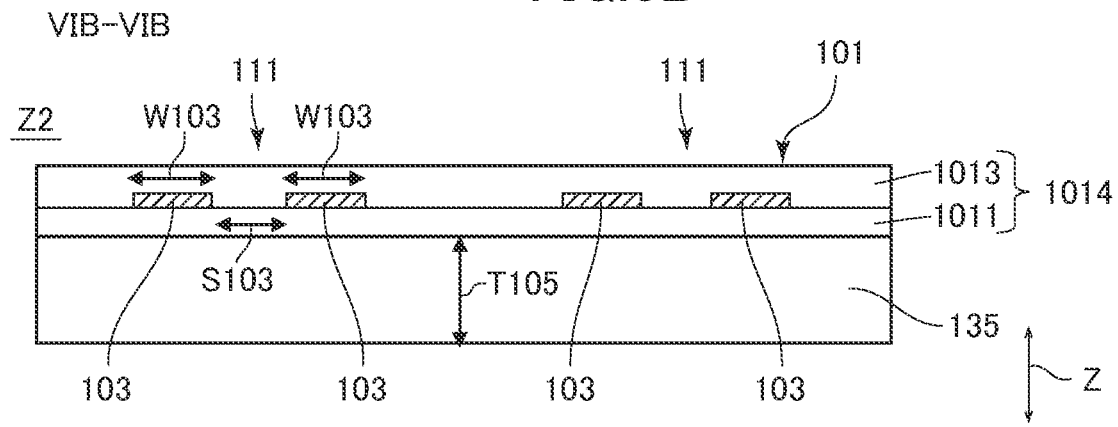
FIG. 6B is a cross-section view of the transmission module according to the first embodiment.
Figure 6C:
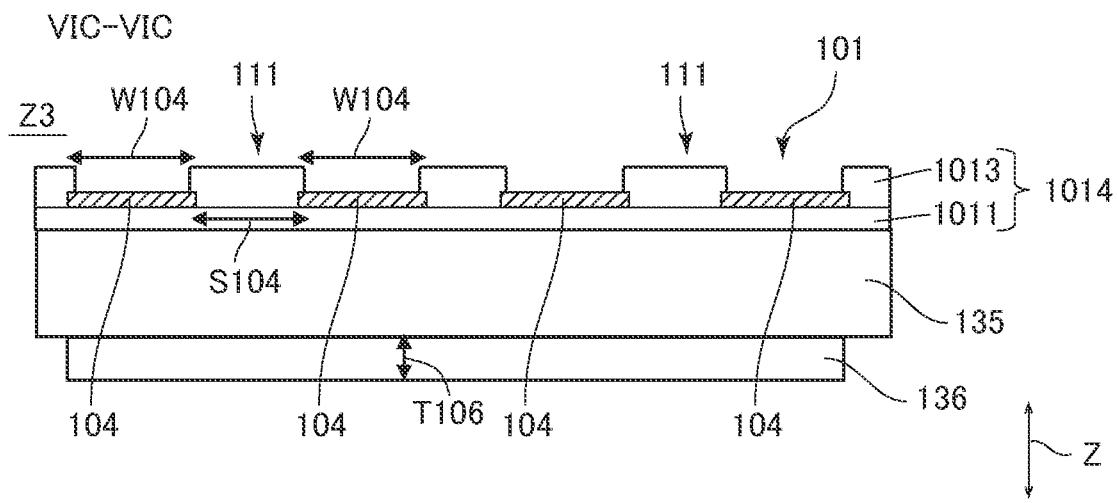
FIG. 6C is a cross-section view of the transmission module according to the first embodiment.

FIG. 5A is a partial plan view of the transmission module 100 according to the first embodiment. FIG. 5B is a partial section view of the transmission module 100 according to the first embodiment. To be noted, in FIG. 5A, illustration of the connector 109 is omitted. FIG. 6A is a cross-section view of the transmission module 100 taken along a line VIA-VIA of FIG. 4A. FIG. 6B is a cross-section view of the transmission module 100 taken along a line VIB-VIB of FIG. 4A. FIG. 6C is a cross-section view of the transmission module 100 taken along a line VIC-VIC of FIG. 4A. To be noted, in FIG. 6C, illustration of the connector 109 is omitted.

The flexible printed wiring board 101 includes an insulating layer 1014 that is electrically insulating and supports the plurality of signal lines 110. The insulating layer 1014 includes a base layer 1011 and a cover layer 1013. The plurality of signal lines 110 are disposed in a conductor layer 1012 on the base layer 1011. The conductor layer 1012 is covered by the cover layer 1013. The base layer 1011 and the cover layer 1013 are formed from, for example, polyimide.

The transmission module 100 includes a reinforcing member 130 disposed at a position opposing the connector 109 with the flexible printed wiring board 101 therebetween. In addition, the transmission module 100 includes a reinforcing member 140 disposed at a position opposing the connector 120 with the flexible printed wiring board 101 therebetween. The reinforcing member 130 includes an insulating layer 135 that is electrically insulating. The reinforcing member 140 includes an insulating layer 145 that is electrically insulating. The reinforcing member 130 is a member for reinforcing the flexible printed wiring board 101 to suppress breakage of the signal lines 110 when attaching or detaching the connector 109 to or from the connector 204. Therefore, the insulating layer 135 is thicker than the flexible printed wiring board 101. Similarly, the reinforcing member 140 is a member for reinforcing the flexible printed wiring board 101 to suppress breakage of the signal lines 110 when attaching or detaching the connector 120 to or from the connector 305. Therefore, the insulating layer 145 is thicker than the flexible printed wiring board 101. As viewed in a Z direction perpendicular to a main surface 1010 of the flexible printed wiring board 101, the reinforcing member 130 is disposed in a region including the entirety of the connector 109. In addition, as viewed in the Z direction, the reinforcing member 140 is disposed in a region including the entirety of the connector 120.

Figure 7A:
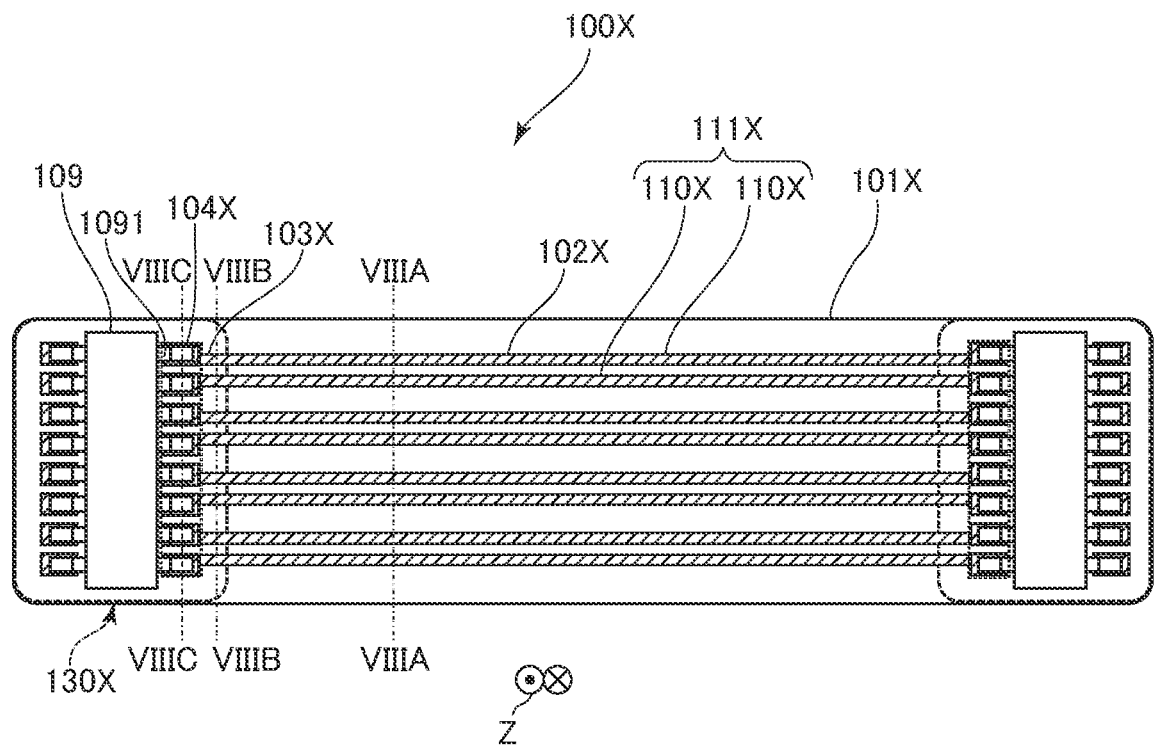
FIG. 7A is a plan view of a transmission module of a comparative example.
Figure 7B:
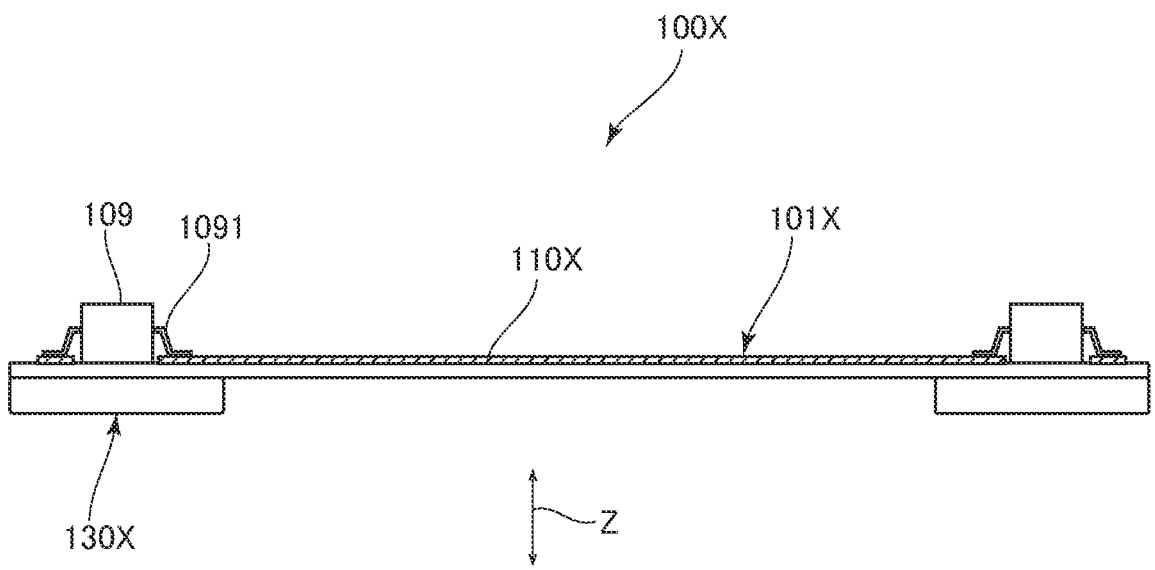
FIG. 7B is a longitudinal section view of the transmission module of the comparative example.
Figure 8A:
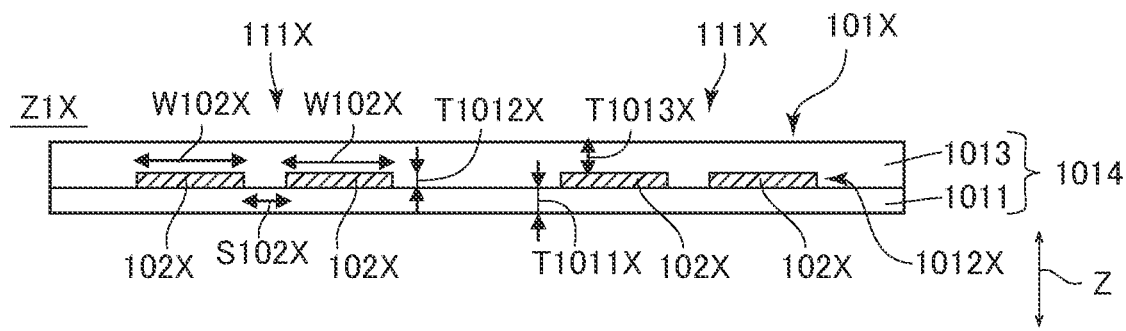
FIG. 8A is a cross-section view of the transmission module of the comparative example.
Figure 8B:
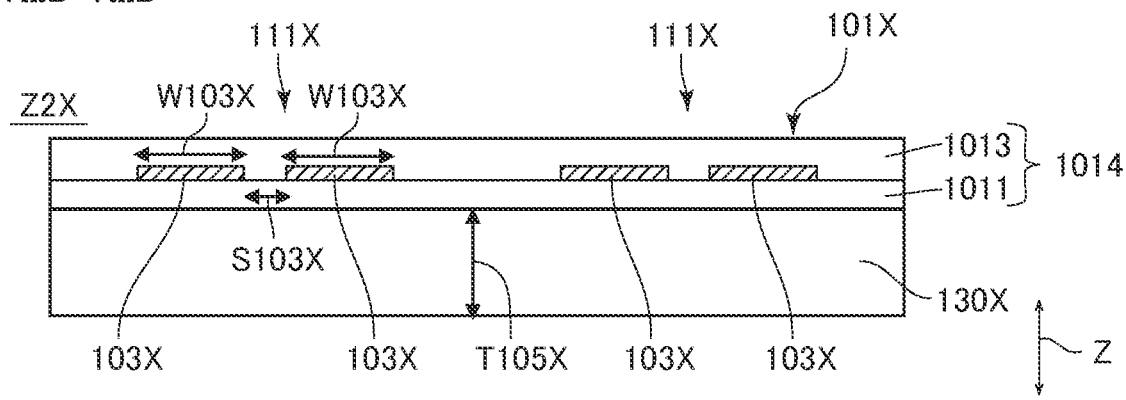
FIG. 8B is a cross-section view of the transmission module of the comparative example.
Figure 8C:
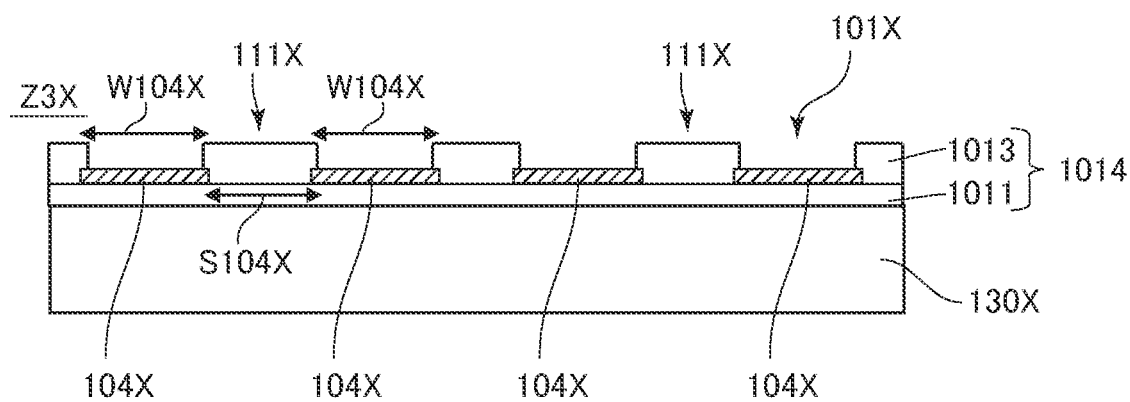
FIG. 8C is a cross-section view of the transmission module of the comparative example.

Here, a transmission module of a comparative example will be described. FIG. 7A is a plan view of a transmission module 100X of a comparative example. FIG. 7B is a longitudinal section view of the transmission module IMX of the comparative example. FIGS. 7A and 7B schematically illustrate the transmission module 100X. FIG. 8A is a cross-section view of the transmission module 100X taken along a line VIIIA-VIIIA of FIG. 7A FIG. 8B is a cross-section view of the transmission module 100X taken along a line VIIIB-VIIIB of FIG. 7A. FIG. 8C is a cross-section view of the transmission module 100X taken along a line VIIIC-VIIIC of FIG. 7A. To be noted, in FIG. 8C, illustration of the connector 109 is omitted.

The transmission module 100X includes a flexible printed wiring board 101X. The flexible printed wiring board 101X includes a plurality of signal lines 110X. The plurality of signal lines 110X are disposed in one conductor layer 1012X. Among the plurality of signal lines 110X, a pair of adjacent signal lines 110X constitute a differential line pair 111X that is a transmission path used for transmitting a differential signal. The flexible printed wiring board 101X includes an insulating layer 1014 that has a configuration having substantially the same configuration as in the first embodiment and supports the plurality of signal lines 110X. The insulating layer 1014 includes the base layer 1011 and the cover layer 1013.

In addition, the transmission module 100X includes the connector 109 mounted on the flexible printed wiring board 101X and having substantially the same configuration as in the first embodiment, and a reinforcing member 130X disposed at a position opposing the connector 109 with the flexible printed wiring board 101X therebetween. The reinforcing member 130X is constituted by only an insulating layer having substantially the same configuration as the insulating layer 135 of the first embodiment. The flexible printed wiring board 101X is a one-sided flexible printed wiring board including one conductor layer 1012X. Therefore, there is no planar ground conductor having a stable potential around the plurality of signal lines 110X.

The signal lines 110X each include a pad 104X bonded to a terminal 1091 of the connector 109, and wiring portions 102X and 103X. As viewed in the Z direction, the pad 104X and the wiring portion 103X overlap the reinforcing member 130X, and the wiring portion 102X does not overlap the reinforcing member 130X. A width W103X of the wiring portion 103X is equal to a width W102X of the wiring portion 102X. In addition, in the differential line pair 111X, a distance S103X between two adjacent wiring portions 103X is equal to a distance S102X between two adjacent wiring portions 102X A width W104X of the pad 104X is larger than each of the width W102X of the wiring portion 102X and the width W103X of the wiring portion 103X. In addition, in the differential line pair 111X, a distance S104X between two adjacent pads 104X is larger than each of the distance S102X between two adjacent wiring portions 102X and the distance S103X between two adjacent wiring portions 103X.

Here, a differential signal is transmitted through the pair of signal lines 110X of the differential line pair 111X. Therefore, a characteristic impedance Z1X of the wiring portion 102X described below is a differential impedance of the pair of wiring portions 102X in the differential line pair 111X. In addition, a characteristic impedance Z2X of the wiring portion 103X is a differential impedance of the pair of wiring portions 103X in the differential line pair 111X. In addition, a characteristic impedance Z3X of the pad 104X is a differential impedance of the pair of pads 104X in the differential line pair 111X.

In the configuration described above, the characteristic impedance Z3X of the pad 104X is higher than the characteristic impedance Z1X of the wiring portion 102X, and the characteristic impedance Z2X of the wiring portion 103X is lower than the characteristic impedance Z1X of the wiring portion 102X. Specifically, the characteristic impedance Z2X of the wiring portion 103X overlapping the reinforcing member 130X having a higher relative permittivity than the air, is lower than the characteristic impedance Z1X of the wiring portion 102X not overlapping the reinforcing member 130X. In addition, since the distance S104X between the two pads 104X is larger than each of the distance S102X between the two wiring portions 102X and the distance S103X between the two wiring portions 103X, the characteristic impedance Z3X of the pad 104X is higher than each of the characteristic impedances Z1X and Z2X. Therefore, there is a difference between the characteristic impedances Z1X and Z2X, and there is a difference between the characteristic impedances Z2X and Z3X. Due to these differences between the characteristic impedances, particularly the difference between the characteristic impedances Z2X and Z3X, a reflection wave of the digital signal is generated as a noise in the signal line 110X. That is, a slight difference between the widths W103X and W104X of the signal line 110X, a slight difference between the distances S103X and S104X between a pair of the signal lines 110X, difference in the relative permittivity around the signal line 110X, and the like make the characteristic impedance of the signal line 110X inconsistent.

When the characteristic impedance is inconsistent in the signal line 110X, a reflection wave, that is, a noise is generated in the signal line 110X, and thus the quality of the digital signal transmitted through the signal line 110X is likely to deteriorate. Further, as the transmission speed of the digital signal increases, the deterioration of the quality of the digital signal transmitted through the signal line 110X becomes greater.

Therefore, in the first embodiment, the reinforcing member 130 is configured in a different manner from the reinforcing member 130X of the comparative example, and the signal line 110 is configured in a different manner from the signal line 110X of the comparative example.

With reference to FIGS. 4A to 6C, the signal line 110 includes wiring portions 102 and 103 as a main line, and a pad 104. The wiring portion 102 serves as an example of a first wiring portion, and is disposed at a position not overlapping the reinforcing member 130 as viewed in the Z direction. The wiring portion 103 serves as a second wiring portion, and is disposed between the wiring portion 102 and the pad 104. The wiring portion 103 and the pad 104 are disposed in a region overlapping the reinforcing member 130 as viewed in the Z direction. The pad 104 is bonded to the terminal 1091 of the connector 109 via solder or the like.

In addition, the signal line 110 includes a wiring portion 105 and a pad 106. The wiring portion 105 is disposed between the wiring portion 102 and the pad 106. The wiring portion 105 and the pad 106 are disposed in a region overlapping the reinforcing member 140 as viewed in the Z direction. The pad 106 is bonded to a terminal 1201 of the connector 120 via solder or the like.

In the first embodiment, the reinforcing member 130 includes a conductive member 136 disposed on the insulating layer 135. In addition, in the first embodiment, the reinforcing member 140 includes a conductive member 146 disposed on the insulating layer 145.

The configuration of the reinforcing member 140 is substantially the same as the reinforcing member 130. In addition, the positional relationship of the reinforcing member 140 with the connector 120, the wiring portion 105, and the pad 106 is substantially the same as the positional relationship of the reinforcing member 130 with the connector 109, the wiring portion 103, and the pad 104. Therefore, detailed description of the reinforcing member 140 will be omitted.

The insulating layer 135 of the reinforcing member 130 is formed in a uniformly constant thickness in a direction parallel to the main surface 1010. Examples of the material of the insulating layer 135 of the reinforcing member 130 include resins such as polyimide, polyethylene terephthalate: PET, and glass epoxy, and among the resins, glass epoxy, which has high rigidity, is particularly preferable. The conductive member 136 of the reinforcing member 130 is disposed on the insulating layer 135. The conductive member 136 is a metal foil such as a copper foil. The conductive member 136 may be electrically connected to an unillustrated ground terminal of the connector 109.

Among the plurality of pads 104, description will be given focusing on one pad 104. As viewed in the Z direction, the reinforcing member 130 includes a first portion P1 disposed in a region including at least part of the pad 104, and a second portion P2 disposed around the first portion P1 as viewed in the Z direction. It is preferable that the region of the first portion P1 includes 90% or more of the area of the pad 104 as viewed in the Z direction. In the first embodiment, as viewed in the Z direction, the first portion P1 is disposed in a region including the entirety of the pad 104.

Focusing on the plurality of the pads 104, that is, all the pads 104, the first portion P1 is disposed in a region including the entirety of the plurality of pads 104 as viewed in the Z direction. Further, the second portion P2 is disposed around the first portion P1 so as to surround the first portion P1 as viewed in the Z direction.

Here, a differential signal is transmitted through the pair of signal lines 110 of the differential line pair 111. Therefore, the characteristic impedance Z1 of the wiring portion 102 described below is a differential impedance of the pair of wiring portions 102 in the differential line pair 111. In addition, the characteristic impedance Z2 of the wiring portion 103 is a differential impedance of the pair of wiring portions 103 in the differential line pair 111. In addition, the characteristic impedance Z3 of the pad 104 is a differential impedance of the pair of pads 104 in the differential line pair 111.

In the first embodiment, a member constituting the first portion P1 is a member having a nature that reduces the characteristic impedance Z3 of the pad 104 more than a member constituting the second portion P2 does.

Specifically, the first portion P1 is constituted by an insulating member 1351 that is part of the insulating layer 135, and the conductive member 136 disposed on the insulating member 1351. As viewed in the Z direction, the insulating member 1351 and the conductive member 136 each have the same shape and size as the first portion P1. In addition, the second portion P2 is constituted by an insulating member 1352 that is part of the insulating layer 135 and disposed around the insulating member 1351. As viewed in the Z direction, the insulating member 1352 has the same shape and size as the second portion P2. The insulating member 1351 serves as an example of a first insulating member. The insulating member 1352 serves as an example of a second insulating member. The insulating member 1351 is formed from the same material as the insulating member 1352 and in the same thickness as the insulating member 1352, and has the same relative permittivity as the insulating member 1352.

As described above, in the first embodiment, the insulating member 1351 and the conductive member 136 are members constituting the first portion P1. In addition, in the first embodiment, the insulating member 1352 having the same relative permittivity and the same thickness as the insulating member 1351 is a member constituting the second portion P2. The member constituted by the insulating member 1351 and the conductive member 136 has a nature that reduces the characteristic impedance of an opposing conductor more than the member constituted by the insulating member 1352 does. Since the reinforcing member 130X of the comparative example has substantially the same configuration as the insulating layer 135, the characteristic impedance Z3 of the first embodiment is reduced more than the characteristic impedance Z3X of the comparative example. That is, since the conductive member 136 is disposed to oppose the pad 104 with the insulating member 1351 therebetween, the characteristic impedance Z3 of the pad 104 is reduced. As a result of this, the absolute value of the difference (Z3-Z2) between the characteristic impedance Z2 of the wiring portion 103 and the characteristic impedance Z3 of the pad 104 can be reduced. Therefore, in the signal line 110, generation of the reflection wave of the digital signal D2, that is, generation of the noise can be reduced, and thus the quality of the digital signal D2 transmitted through the signal line 110 can be improved.

A width W104 of the pad 104 is preferably larger than each of a width W102 of the wiring portion 102 and a width W103 of the wiring portion 103 for bonding the terminal 1091 of the connector 109 thereto. In addition, a distance S104 between the pair of pads 104 is preferably larger than each of a distance S102 between a pair of wiring portions 102 and a distance S103 between a pair of wiring portions 103 for bonding the terminal 1091 of the connector 109 thereto.

In addition, the width W103 of the wiring portion 103 is preferably equal to or less than the width W102 of the wiring portion 102. As viewed in the Z direction, the wiring portion 103 overlaps the second portion P2 of the reinforcing member 130 having a higher relative permittivity than the air. Therefore, the width W103 of the wiring portion 103 may be equal to the width W102 of the wiring portion 102 not overlapping the reinforcing member 130, but is preferably smaller than the width W102. As a result of this, the characteristic impedance Z2 of the wiring portion 103 is higher than the characteristic impedance Z2X of the wiring portion 103X of the comparative example. Therefore, the absolute value of the difference (Z2-Z1) between the characteristic impedance Z1 of the wiring portion 102 and the characteristic impedance Z2 of the wiring portion 103 can be reduced. In addition, the absolute value of the difference (Z3-Z2) between the characteristic impedance Z2 of the wiring portion 103 and the characteristic impedance Z3 of the pad 104 can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, the distance S103 between a pair of the wiring portions 103 is preferably equal to or larger than the distance S102 between a pair of the wiring portions 102. As viewed in the Z direction, the pair of the wiring portions 103 overlaps the second portion P2 of the reinforcing member 130 having a higher relative permittivity than the air. Therefore, the distance S103 between the pair of the wiring portions 103 may be equal to the distance S102 of the pair of the wiring portions 102 not overlapping the reinforcing member 130, but is preferably larger than the distance S102. As a result of this, the characteristic impedance Z2 is higher than the characteristic impedance Z2X of the comparative example. Therefore, the absolute value of the difference (Z2-Z1) between the characteristic impedance Z1 and the characteristic impedance Z2 and the absolute value of the difference (Z3-Z2) between the characteristic impedance Z2 and the characteristic impedance Z3 can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, as viewed in the Z direction, although the wiring portion 103 may partially overlap the first portion P1, since the first portion P1 has a nature that reduces the characteristic impedance of an opposing conductor, it is preferable that the wiring portion 103 does not overlap the first portion P1. As a result of this, reduction of the characteristic impedance Z2 of the wiring portion 103 can be suppressed, and the absolute value of the difference (Z2-Z1) and the absolute value of the difference (Z3-Z2) can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, although the reinforcing member 130 has been described, since the reinforcing member 140 has substantially the same configuration as the reinforcing member 130, the quality of the digital signal D2 transmitted through the signal line 110 can be more effectively improved.

Example 1

Simulation of differential impedance was performed for the transmission module 100 according to the first embodiment. HyperLynx available from Mentor Graphics was used for the simulation of the differential impedance.

The thickness of the base layer 1011 is denoted by T1011, the thickness of the conductor layer 1012 is denoted by T1012, the thickness of a portion of the cover layer 1013 overlapping the signal line 110 on the conductor layer 1012 is denoted by T1013. In addition, the thickness of the insulating layer 135 is denoted by T105, and the thickness of the conductive member 136 is denoted by T106. In the simulation, parameter values of the respective thicknesses were as follows: T1011=12.5 µm; T1012=12 µm;

T1013=27.5 μm; T105=265 μm and T106=115 μm. To be noted, the thickness T105 of the insulating layer 135 includes a thickness of 15 μm of an adhesive between the insulating layer 135 and the base layer 1011. In addition, the thickness T106 of the conductive member 136 includes a thickness of 15 μm of an adhesive between the conductive member 136 and the insulating layer 135. The relative permittivity of the base layer 1011 was set to 3.3, the relative permittivity of the cover layer 1013 was set to 3.6, the relative permittivity of the insulating layer 135 of the reinforcing member 130 was set to 4.7, and the relative permittivity of the adhesive was set to 4.0. The conductivity of the signal line 110 and the conductivity of the conductive member 136 were set to $1.724 \times 10^{-8}$ Ωm.

In addition, in the simulation, the parameter values of the width W104 and the distance S104 were as follows: W104=250 μm; and S104=150 μm.

As Example 1, simulation was performed for three patterns while changing the magnitude relationship between the width W102 and the width W103, and the magnitude relationship between the distance S102 and the distance S103. The simulation results of the three patterns are shown in the following Table 1 as Examples 1-1, 1-2, and 1-3.

1011 was set to 3.3, the relative permittivity of the cover layer 1013 was set to 3.6, the relative permittivity of the reinforcing member 130X was set to 4.7, and the relative permittivity of the adhesive was set to 4.0.

The simulation results of the differential impedance of Comparative Example 1 will be described. The characteristic impedance (differential impedance) Z1X of the wiring portion 102X was 103.8Ω. The characteristic impedance (differential impedance) Z2X of the wiring portion 103X was 85.5Ω. The characteristic impedance (differential impedance) Z3X of the pad 104X was 118.2Ω.

The distance S104X between a pair of the pads 104X is larger than each of the distance S102X between a pair of the wiring portions 102X and the distance S103X between a pair of the wiring portions 103X. Therefore, in the configuration of Comparative Example 1 not including the conductive member 136, the characteristic impedance (differential impedance) Z3X of the pad 104X was higher than the characteristic impedance Z2X of the wiring portion 103X. The difference (Z3X-Z2X) between the characteristic impedances was 32.7Ω.

In contrast, in Examples 1-1, 1-2, and 1-3, the difference (Z3-Z2) in the characteristic impedance were respectively

TABLE 1

| | | | | | | Z1 = 103.8Ω |
|---|---|---|---|---|---|---|
| | MAGNITUDE RELATIONSHIP | W102 | W103 | S102 | S103 | Z2 |
| Example 1-1 | W102 > W103 S102 < S103 | 150 μm | 130 μm | 45 μm | 65 μm | 100.5Ω Z2 − Z1 = −3.3Ω |
| Example 1-2 | W102 > W103 S102 = S103 | 150 μm | 65 μm | 45 μm | 45 μm | 100.1Ω Z2 − Z1 = −3.7Ω |
| Example 1-3 | W102 = W103 S102 < S103 | 150 μm | 150 μm | 45 μm | 70 μm | 100.3Ω Z2 − Z1 = −3.5Ω |

To be noted, in Example 1-1, W104>W102>W103 and S104>S103>S102 held. In Example 1-2, W104>W102>W103 and S104>S103=S102 held. In Example 1-3, W104>W102=W103 and S104>S103>S102 held.

In each of Examples 1-1, 1-2, and 1-3, the characteristic impedance (differential impedance) Z1 of the wiring portion 102 was 103.8Ω The characteristic impedance (differential impedance) Z3 of the pad 104 was 102.2Ω.

Comparative Example 1

In addition, the simulation of differential impedance was also performed for the transmission module 100X of the comparative example illustrated in FIGS. 7A to 8C. HyperLynx available from Mentor Graphics was used for the simulation of the differential impedance.

The thickness of the base layer 1011 is denoted by T1011X, the thickness of the conductor layer 1012X is denoted by T1012X, the thickness of a portion of the cover layer 1013 overlapping the signal line 110X on the conductor layer 1012X is denoted by T1013X In addition, the thickness of the reinforcing member 130X is denoted by T105X. In the simulation, parameter values of the respective thicknesses were as follows, similarly to Example 1: T1011X=12.5 μm; T1012X=12 μm; T1013X=27.5 μm; and T105X=265 μm. To be noted, the thickness T105X of the reinforcing member 130X includes a thickness of 15 μm of an adhesive between the reinforcing member 130X and the base layer 1011. The relative permittivity of the base layer 1.7 Ω, 2.1Ω, and 1.9Ω. Therefore, in all of Examples 1-1, 1-2, and 1-3, the absolute value |Z3-Z2| of the difference in the characteristic impedance was smaller than the absolute value |Z3X-Z2X| of the difference in the characteristic impedance of Comparative Example 1. Therefore, in each of Examples 1-1, 1-2, and 1-3, the characteristic impedance was more consistent than in Comparative Example 1. Therefore, in Examples 1-1, 1-2, and 1-3, the generation of the reflection wave can be reduced Particularly, in Example 1-1, the absolute value |Z3-Z2| of the difference in the characteristic impedance was smaller than in Examples 1-2 and 1-3. Therefore, in Example 1-1, the generation of the reflection wave can be reduced as compared with Examples 1-2 and 1-3.

In addition, in Example 1-3, the absolute value |Z3-Z2| of the difference in the characteristic impedance was smaller than in Example 1-2. Therefore, in Example 1-3, the generation of the reflection wave can be reduced as compared with Example 1-2.

In addition, the effective permittivity of the surroundings of the wiring portion 103X was higher than the effective permittivity of the surroundings of the wiring portion 102X. Therefore, the characteristic impedance Z2X of the wiring portion 103X was lower than the characteristic impedance Z1X of the wiring portion 102X, and the difference (Z2X-Z1X) in the characteristic impedance was −18.3Ω.

Meanwhile, as shown in Table 1, the difference (Z2-Z1) in the characteristic impedance in Examples 1-1, 1-2, and 1-3 were respectively −3.3 Ω, −3.7Ω, and −3.5Ω. Therefore, in all of Examples 1-1, 1-2, and 1-3, the absolute value |Z2-Z1| of the difference in the characteristic impedance was smaller than the absolute value |Z2X-Z1X| of the difference in the characteristic impedance of Comparative Example 1. Therefore, in each of Examples 1-1, 1-2, and 1-3, the characteristic impedance was more consistent than in Comparative Example 1. Therefore, in Examples 1-1, 1-2, and 1-3, the generation of the reflection wave can be effectively reduced.

Particularly, in Example 1-1, the absolute value |Z2-Z1| of the difference in the characteristic impedance was smaller than in Examples 1-2 and 1-3. Therefore, in Example 1-1, the generation of the reflection wave can be reduced as compared with Examples 1-2 and 1-3.

In addition, in Example 1-3, the absolute value |Z2-Z1| of the difference in the characteristic impedance was smaller than in Example 1-2. Therefore, in Example 1-3, the generation of the reflection wave can be reduced as compared with Example 1-2.

In Example 1, the effect of the consistency of the characteristic impedance increases as the transmission speed increases. For example, in the case where the length of the pads 104 and 104X in the wiring direction is 1 mm, the transmission time of the signal is about 7 ps. In the case where the transmission speed is 5 Gbps (signal period: 200 ps), the rising time of the signal is about 40 ps to 66 ps (about ⅕ to ⅓ of the period). Therefore, in the pads 104 and 104X, the rising time of the signal is longer than the transmission time of the signal. Therefore, even in the case of Comparative Example 1, the deterioration of the signal waveform caused by the inconsistency of the impedance in the pad 104X is small.

However, in the case where the transmission speed is 10 Gbps (signal period: 100 ps), the rising time of the signal is about 20 ps to 33 ps. Therefore, in Comparative Example 1, deterioration of the signal waveform caused by the inconsistency of the impedance of the pad 104 starts becoming apparent in Comparative Example 1. In the case where the transmission speed is 20 Gbps (signal period: 50 ps), the rising time of the signal is about 10 ps to 17 ps. Therefore, in Comparative Example 1, the deterioration of the signal wavelength caused by the inconsistency of the impedance of the pad 104X becomes prominent.

In addition, in the case of multilevel transmission such as 4-level or 16-level transmission, waveforms of different signal amplitudes are mixed, and therefore the S/N ratio of a signal of a low amplitude is lower than the S/N ratio of a signal of a high amplitude. Therefore, the deterioration of the waveform caused by the inconsistency of the impedance is likely to occur in a signal of a low amplitude.

In contrast, in Example 1, since the impedance is consistent between the pad 104 and the wiring portion 103, the deterioration of the signal waveform is less likely to occur no matter whether the transmission speed of the signal is 10 Gbps or 20 Gbps, and the quality of the signal is improved.

Second Embodiment

Figure 9A:
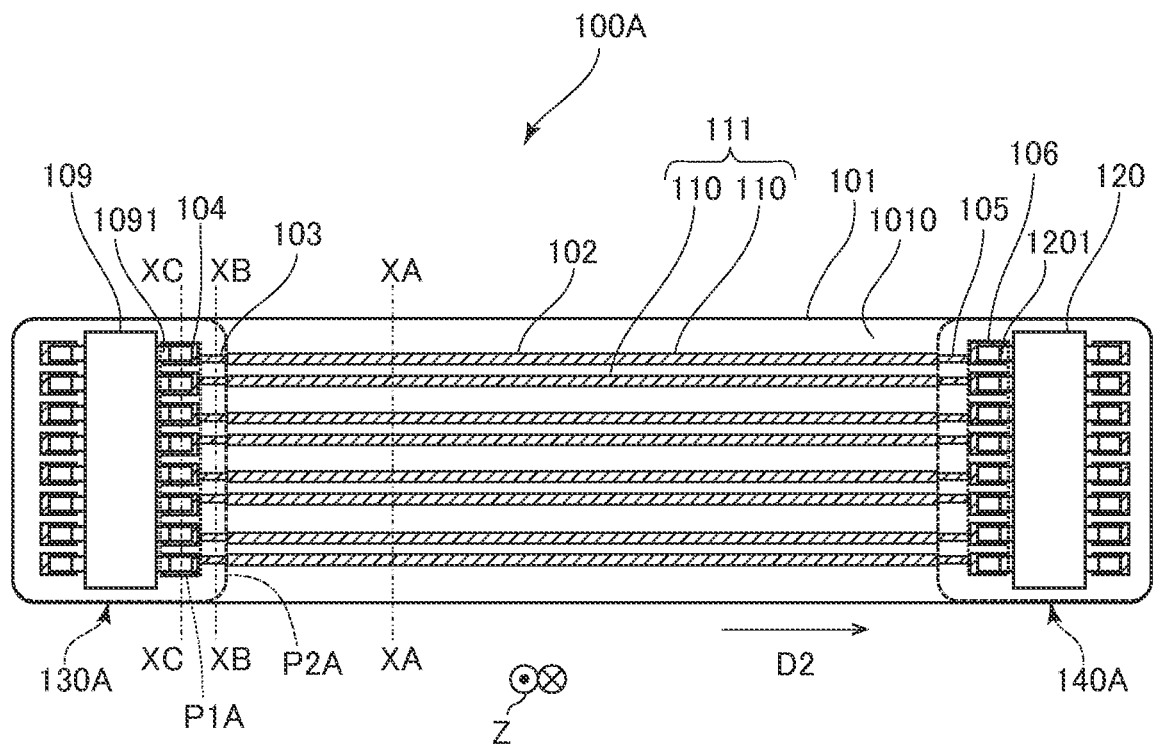
FIG. 9A is a plan view of a transmission module according to a second embodiment.
Figure 9B:
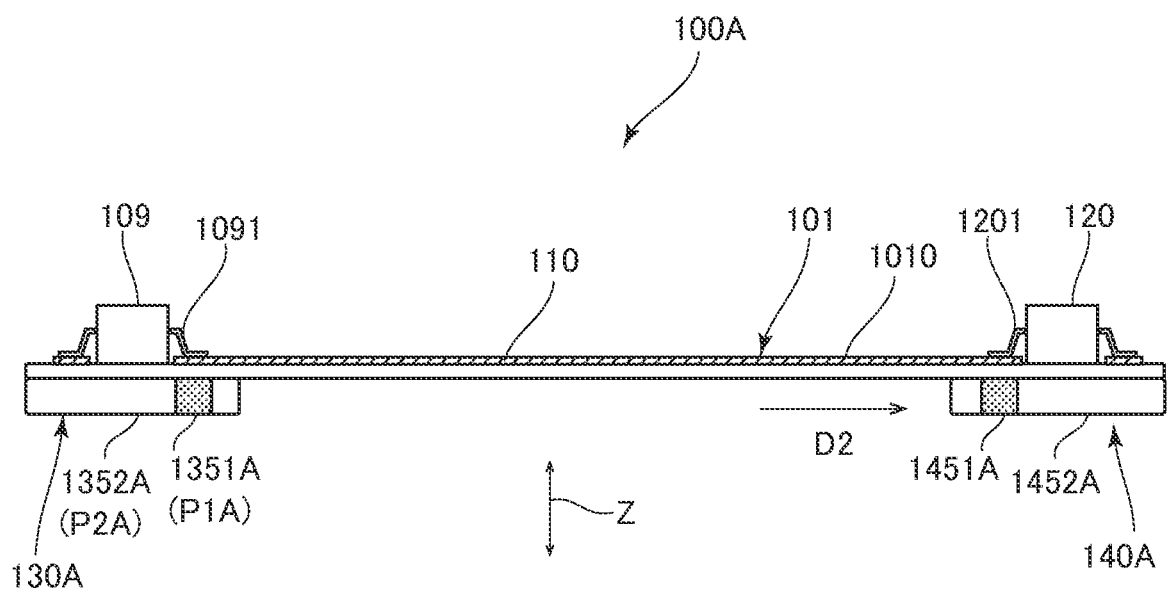
FIG. 9B is a longitudinal section view of the transmission module according to the second embodiment.

Next, a transmission module of a second embodiment will be described. FIG. 9A is a plan view of a transmission module 100A according to the second embodiment. FIG. 9B is a longitudinal section view of the transmission module 100A according to the second embodiment. FIGS. 9A and 9B schematically illustrate the transmission module 100A. In the second embodiment, the transmission module 100A is applied to the electronic unit 500 in place of the transmission module 100 of the first embodiment. Therefore, description of elements substantially the same as in the first embodiment will be omitted.

Figure 10A:
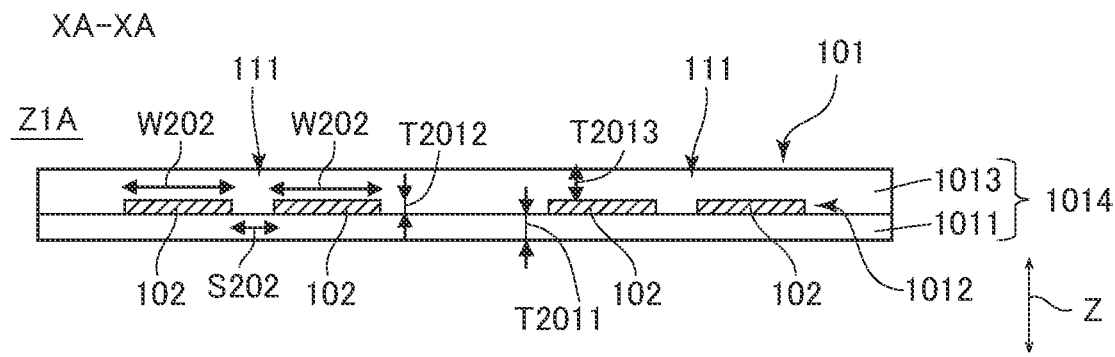
FIG. 10A is a cross-section view of the transmission module according to the second embodiment.
Figure 10B:
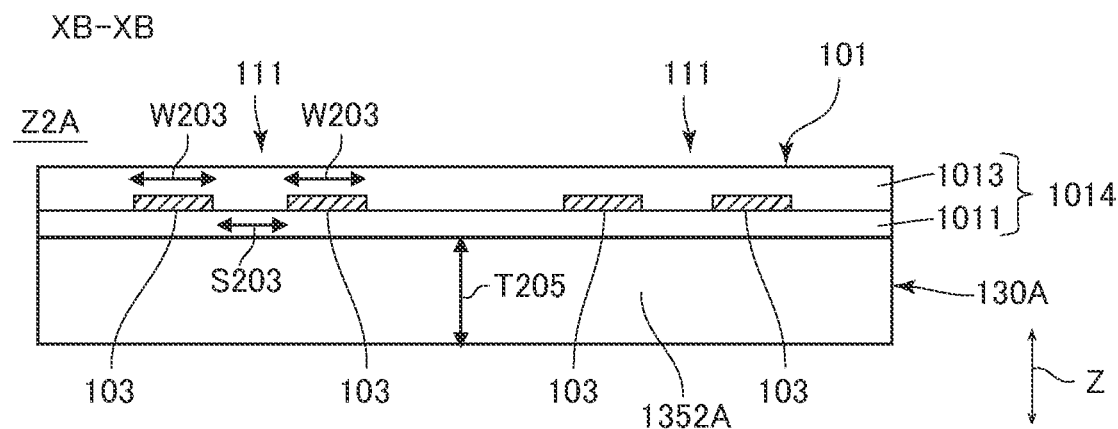
FIG. 10B is a cross-section view of the transmission module according to the second embodiment.
Figure 10C:
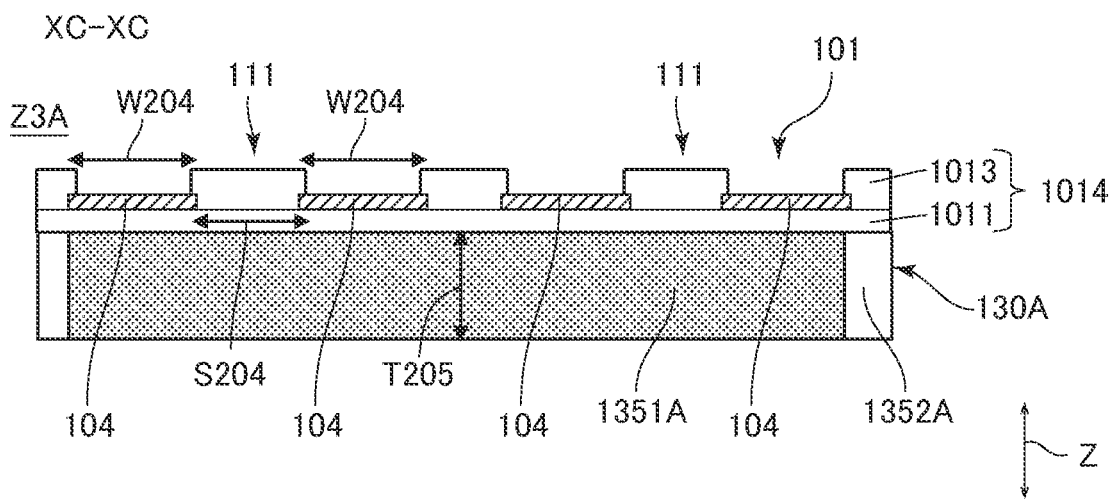
FIG. 10C is a cross-section view of the transmission module according to the second embodiment.

The transmission module 100A of the second embodiment includes the flexible printed wiring board 101, the connector 109, and the connector 120 described in the first embodiment. To be noted, in FIGS. 9A and 9B, the flexible printed wiring board 101 is stretched straight. FIG. 10A is a cross-section view of the transmission module 100A taken along a line XA-XA of FIG. 9A. FIG. 10B is a cross-section view of the transmission module 100A taken along a line XB-XB of FIG. 9A. FIG. 10C is a cross-section view of the transmission module 100A taken along a line XC-XC of FIG. 9A. To be noted, in FIG. 10C, illustration of the connector 109 is omitted.

The flexible printed wiring board 101 includes a plurality of signal lines 110 used for transmission of the digital signal D2. Among the plurality of signal lines 110, pairs of adjacent signal lines 110 each constitute a differential line pair 111 that is a transmission path used for transmitting a differential signal. The signal lines 110 each include the wiirng portion 102, the wiring portion 103, the pad 104, the wiring portion 105, and the pad 106.

The transmission module 100A of the second embodiment includes a reinforcing member 130A disposed at a position opposing the connector 109 with the flexible printed wiring board 101 therebetween. In addition, the transmission module 100A includes a reinforcing member 140A disposed at a position opposing the connector 120 with the flexible printed wiring board 101 therebetween.

The reinforcing member 130A includes insulating members 1351A and 1352A that are electrically insulating. The relative permittivity of the insulating member 1351A is higher than the relative permittivity of the insulating member 1352A. The reinforcing member 140A includes insulating members 1451A and 1452A that are electrically insulating. The relative permittivity of the insulating member 1451A is higher than the relative permittivity of the insulating member 1452A.

The reinforcing member 130A is a member for reinforcing the flexible printed wiring board 101 to suppress breakage of the signal lines 110 when attaching or detaching the connector 109 to or from the connector 204. Therefore, the reinforcing member 130A is thicker than the flexible printed wiring board 101. Similarly, the reinforcing member 140A is a member for reinforcing the flexible printed wiring board 101 to suppress breakage of the signal lines 110 when attaching or detaching the connector 120 to or from the connector 305. Therefore, the reinforcing member 140A is thicker than the flexible printed wiring board 101. As viewed in the Z direction perpendicular to the main surface 1010 of the flexible printed wiring board 101, the reinforcing member 130A is disposed in a region including the entirety of the connector 109. In addition, as viewed in the Z direction, the reinforcing member 140A is disposed in a region including the entirety of the connector 120.

The configuration of the reinforcing member 140A is substantially the same as the configuration of the reinforcing member 130A. In addition, the positional relationship of the reinforcing member 140A with the connector 120, the wiring portion 105, and the pad 106 is substantially the same as the positional relationship of the reinforcing member 130A with the connector 109, the wiring portion 103, and the pad 104. Therefore, detailed description of the reinforcing member 140A will be omitted.

The insulating member 1351A of the reinforcing member 130A serves as an example of a first insulating member. The insulating member 1352A of the reinforcing member 130A serves as an example of a second insulating member.

The insulating member 1352A is formed in a uniformly constant thickness in a direction parallel to the main surface 1010. Examples of the material of the insulating member 1352A include resins such as polyimide, PET, and glass epoxy, and among the resins, glass epoxy, which has high rigidity, is particularly preferable. The insulating member 1351A is formed in the same thickness as the insulating member 1352A. The material of the insulating member 1351A is, for example, alumina.

Among the plurality of pads 104, description will be given focusing on one pad 104. As viewed in the Z direction, the reinforcing member 130A includes a first portion P1A disposed in a region including at least part of the pad 104, and a second portion P2A disposed around the first portion P1A as viewed in the Z direction. It is preferable that the region of the first portion P1A includes 90% or more of the area of the pad 104 as viewed in the Z direction. In the second embodiment, as viewed in the Z direction, the first portion P1A is disposed in a region including the entirety of the pad 104.

Focusing on the plurality of the pads 104, that is, all the pads 104, the first portion P1A is disposed in a region including entirety of the plurality of pads 104 as viewed in the Z direction. Further, the second portion P2A is disposed around the first portion PIA so as to surround the first portion P1A as viewed in the Z direction.

Here, a differential signal is transmitted through the pair of signal lines 110 of the differential line pair 111. Therefore, a characteristic impedance Z1A of the wiring portion 102 described below is a differential impedance of the pair of wiring portions 102 in the differential line pair 111. In addition, a characteristic impedance Z2A of the wiring portion 103 is a differential impedance of the pair of wiring portions 103 in the differential line pair 111. In addition, a characteristic impedance Z3A of the pad 104 is a differential impedance of the pair of pads 104 in the differential line pair 111.

In the second embodiment, a member constituting the first portion P1A is a member having a nature that reduces the characteristic impedance Z3A of the pad 104 more than a member constituting the second portion P2A does.

Specifically, the first portion P1A is constituted by the insulating member 1351A described above. As viewed in the Z direction, the insulating member 1351A has the same shape and size as the first portion P1A. In addition, the second portion P2A is constituted by the insulating member 1352A disposed around the insulating member 1351A. As viewed in the Z direction, the insulating member 1352A has the same shape and size as the second portion P2A. The insulating member 1351A is formed from a different material from the insulating member 1352A but in the same thickness as the insulating member 1352A, and has a higher relative permittivity than the insulating member 1352A.

As described above, in the second embodiment, the insulating member 1351A is a member constituting the first portion P1A. In addition, in the second embodiment, the insulating member 1352A formed from a different material from the insulating member 1351A is a member constituting the second portion P2A. The insulating member 1351A has a nature that reduces the characteristic impedance of an opposing conductor more than the insulating member 1352A does. The reinforcing member 130X of the comparative example is formed from the same material as and in the same thickness as the insulating member 1352A. Therefore, the characteristic impedance Z3A of the second embodiment is reduced more than the characteristic impedance Z3X of the comparative example. That is, since the insulating member 1351A is disposed to oppose the pad 104, the characteristic impedance Z3A of the pad 104 is reduced. As a result of this, the absolute value of the difference (Z3A-Z2A) between the characteristic impedance Z2A of the wiring portion 103 and the characteristic impedance Z3A of the pad 104 can be reduced. Therefore, in the signal line 110, generation of the reflection wave of the digital signal D2, that is, generation of the noise can be reduced, and thus the quality of the digital signal D2 transmitted through the signal line 110 can be improved.

A width W204 of the pad 104 is preferably larger than each of a width W202 of the wiring portion 102 and a width W203 of the wiring portion 103 for bonding the terminal 1091 of the connector 109 thereto. In addition, a distance S204 between the pair of pads 104 is preferably larger than each of a distance S202 between a pair of wiring portions 102 and a distance S203 between a pair of wiring portions 103 for bonding the terminal 1091 of the connector 109 thereto.

In addition, the width W203 of the wiring portion 103 is preferably equal to or less than the width W202 of the wiring portion 102. As viewed in the Z direction, the wiring portion 103 overlaps the second portion P2A of the reinforcing member 130A having a higher relative permittivity than the air. Therefore, the width W203 of the wiring portion 103 may be equal to the width W202 of the wiring portion 102 not overlapping the reinforcing member 130A, but is preferably smaller than the width W202. As a result of this, the characteristic impedance Z2A of the wiring portion 103 is higher than the characteristic impedance Z2X of the wiring portion 103X of the comparative example. Therefore, the absolute value of the difference (Z2A-ZIA) between the characteristic impedance Z1A of the wiring portion 102 and the characteristic impedance Z2A of the wiring portion 103 can be reduced. In addition, the absolute value of the difference (Z3A-Z2A) between the characteristic impedance Z2A of the wiring portion 103 and the characteristic impedance Z3A of the pad 104 can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, the distance S203 between a pair of the wiring portions 103 is preferably equal to or larger than the distance S202 between a pair of the wiring portions 102. As viewed in the Z direction, the pair of the wiring portions 103 overlaps the second portion P2A of the reinforcing member 130A having a higher relative permittivity than the air. Therefore, the distance S203 between the pair of the wiring portions 103 may be equal to the distance S202 of the pair of the wiring portions 102 not overlapping the reinforcing member 130A, but is preferably larger than the distance S202. As a result of this, the characteristic impedance Z2A is higher than the characteristic impedance Z2X of the comparative example. Therefore, the absolute value of the difference (Z2A-Z1A) between the characteristic impedance Z1A and the characteristic impedance Z2A and the absolute value of the difference (Z3A-Z2A) between the characteristic impedance Z2A and the characteristic impedance Z3A can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, as viewed in the Z direction, although the wiring portion 103 may partially overlap the first portion P1A, since the first portion P1A has a nature that reduces the characteristic impedance of an opposing conductor, it is preferable that the wiring portion 103 does not overlap the first portion P1A. As a result of this, reduction of the characteristic impedance Z2A of the wiring portion 103 can be suppressed, and the absolute value of the difference (Z2A-Z1A) and the absolute value of the difference (Z3A-Z2A) can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

To be noted, although the reinforcing member 130A has been described, since the reinforcing member 140A has substantially the same configuration as the reinforcing member 130A, the quality of the digital signal D2 transmitted through the signal line 110 can be more effectively improved.

In addition, the first portion PIA may further include the conductive member 136 having substantially the same configuration as in the first embodiment.

Example 2

Simulation of differential impedance was performed for the transmission module 100A according to the second embodiment. HyperLynx available from Mentor Graphics was used for the simulation of the differential impedance. The thickness of the base layer 1011 is denoted by T2011, the thickness of the conductor layer 1012 is denoted by T2012, and the thickness of a portion of the cover layer 1013 overlapping the signal line 110 on the conductor layer 1012 is denoted by T2013. In addition, the thickness of the reinforcing member 130A, that is, the thickness of the insulating member 1351A and 1352A is denoted by T205. In the simulation, parameter values of the respective thicknesses were as follows: T2011=12.5 μm; T2012=12 μm; T2013=27.5 μm; and T205=430 μm. To be noted, the thickness 1205 of the reinforcing member 130A includes a thickness of 30 μm of an adhesive between the reinforcing member 130A and the base layer 1011. The relative permittivity of the base layer 1011 was set to 3.3, the relative permittivity of the cover layer 1013 was set to 3.6, the relative permittivity of the insulating member 1352A of the reinforcing member 130A was set to 4.7, and the relative permittivity of the adhesive was set to 4.0. The relative permittivity of the insulating member 1351A was set to 9.8. The conductivity of the signal line 110 was set to $1.724 \times 10^{-8}$ Ωm.

The width of the wiring portion 102 is denoted by W202, the width of the wiring portion 103 is denoted by W203, and the width of the pad 104 is denoted by W204. In addition, the distance between a pair of the wiring portions 102 in the differential line pair 111 is denoted by S202, the distance between a pair of the wiring portions 103 in the differential line pair 111 is denoted by S203, and the distance between a pair of the pads 104 in the differential line pair 111 is denoted by S204. In the simulation, the values of the widths and the distances were as follows: W202=150 μm; S202=45 μm; W203=120 μm; S203=75 μm; W204=250 μm: and S204=150 μm. As described above, in Example 2, W204>W202>W203 and S204>S203>S202 hold.

In Example 2, the characteristic impedance (differential impedance) Z1A of the wiring portion 102 was 103.8Ω. The characteristic impedance (differential impedance) Z2A of the wiring portion 103 was 99.2Ω. The characteristic impedance (differential impedance) Z3A of the pad 104 was 100.8Ω.

In Comparative Example 1, the difference (Z3X-Z2X) in the characteristic impedance was 32.7Ω. In contrast, in Example 2, the difference (Z3A-Z2A) in the characteristic impedance was 1.6Ω. Therefore, the absolute value |Z3A-Z2A| of the difference in the characteristic impedance of Example 2 was smaller than the absolute value |Z3X-Z2X| of the difference in the characteristic impedance of Comparative Example 1, which indicates that the characteristic impedance was more consistent in Example 2 than in Comparative Example 1. Therefore, in Example 2, generation of the reflection wave can be reduced.

In Comparative Example 1, the difference (Z2X-Z1X) in the characteristic impedance was −18.3Ω. In contrast, in Example 2, the difference (Z2A-Z1A) in the characteristic impedance was −4.6Ω. Therefore, the absolute value |Z2A-Z1A| of the difference in the characteristic impedance of Example 2 was smaller than the absolute value |Z2X-Z1X| of the difference in the characteristic impedance of Comparative Example 1, which indicates that the characteristic impedance was more consistent in Example 2 than in Comparative Example 1. Therefore, in Example 2, generation of the reflection wave can be reduced.

Third Embodiment

Figure 11A:
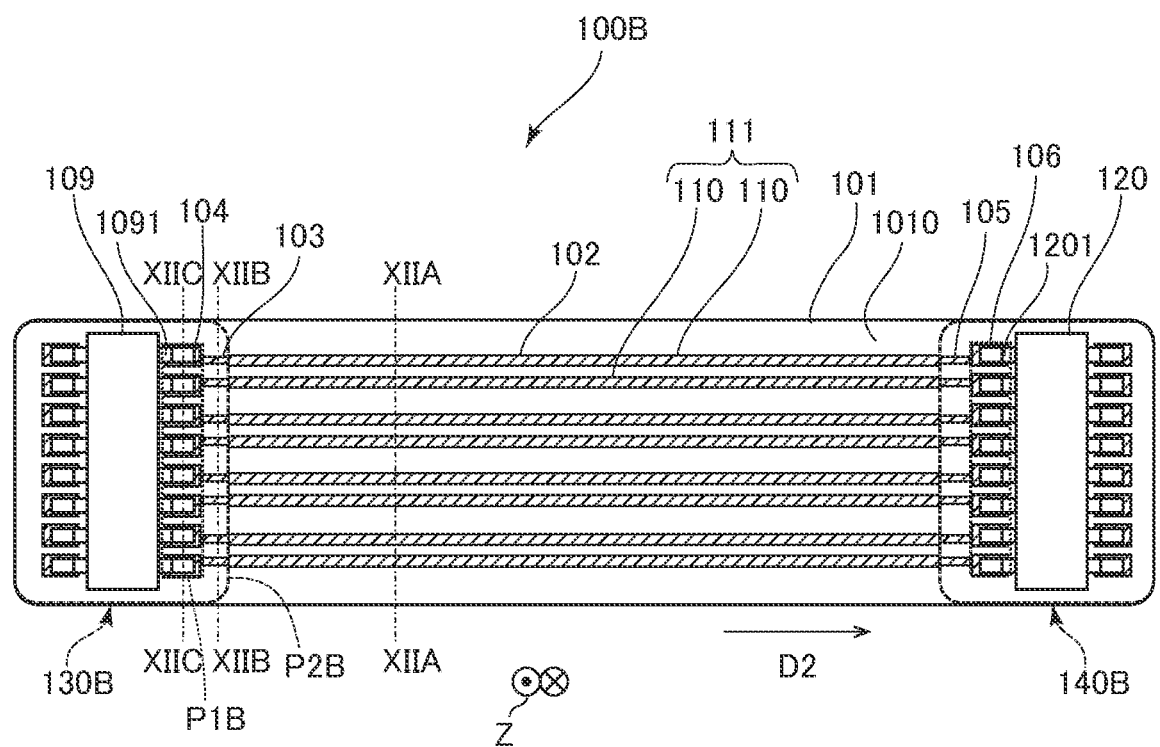
FIG. 11A is a plan view of a transmission module according to a third embodiment.
Figure 11B:
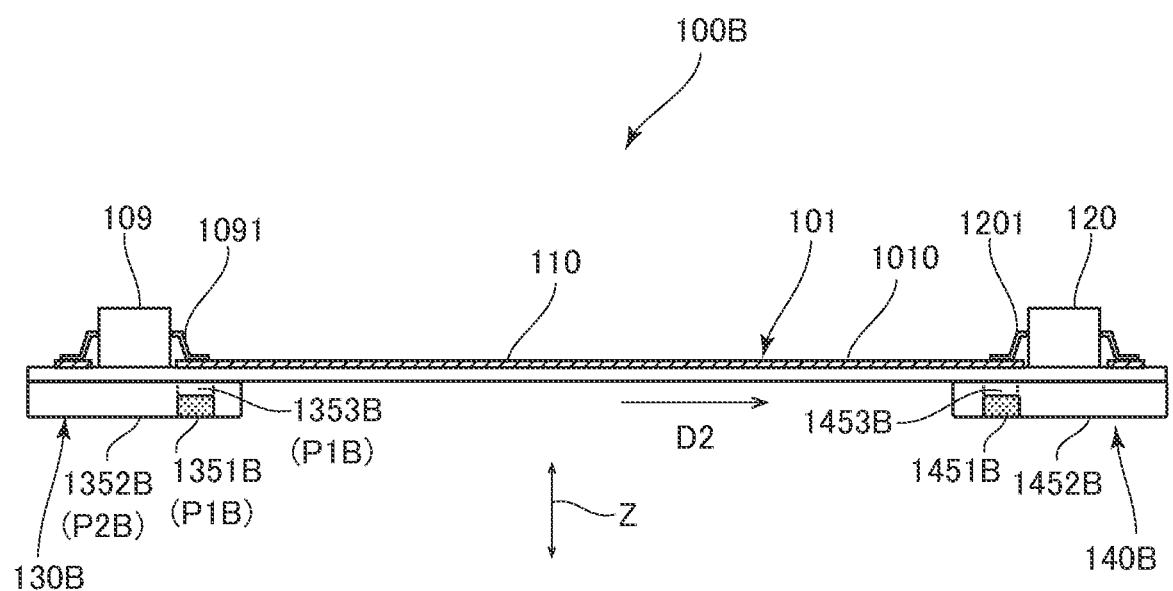
FIG. 11B is a longitudinal section view of the transmission module according to the third embodiment.

Next, a transmission module of a third embodiment will be described. FIG. 11A is a plan view of a transmission module 100B according to the third embodiment. FIG. 11B is a longitudinal section view of the transmission module 100B according to the third embodiment. FIGS. 11A and 11B schematically illustrate the transmission module 100B. In the third embodiment, the transmission module 100B is applied to the electronic unit 500 in place of the transmission module 100 of the first embodiment. Therefore, description of elements substantially the same as in the first embodiment will be omitted.

Figure 12A:
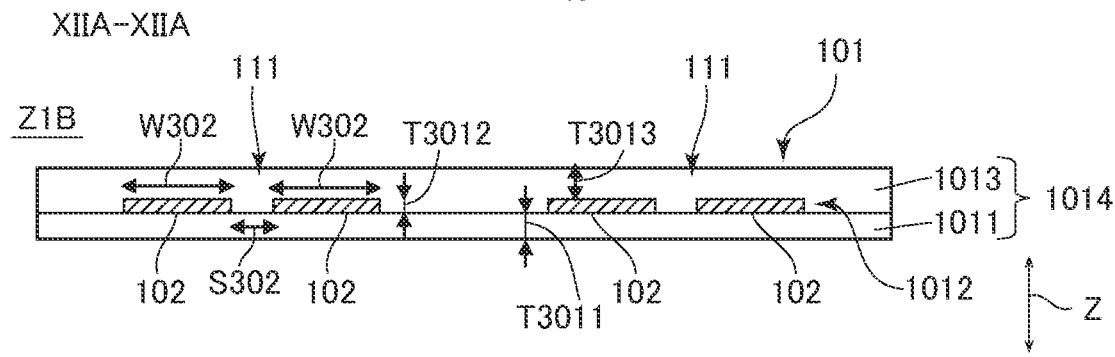
FIG. 12A is a cross-section view of the transmission module according to the third embodiment.
Figure 12B:
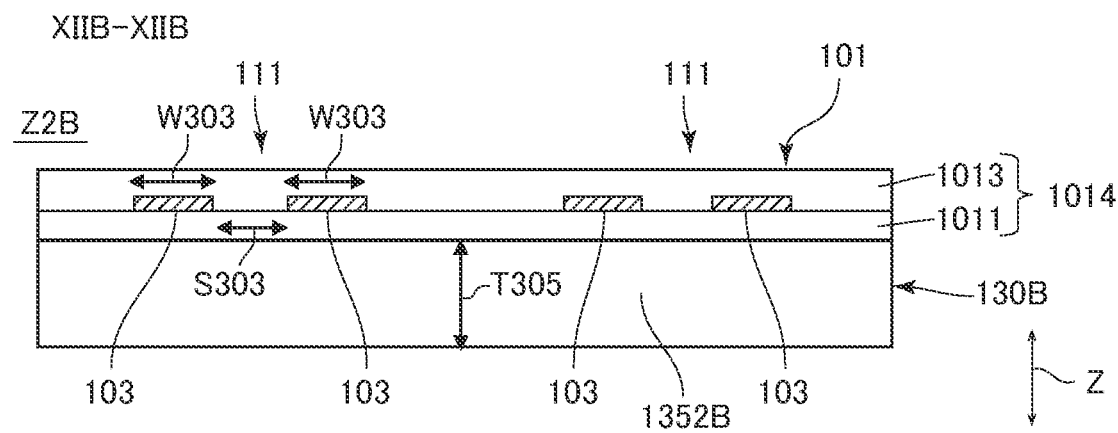
FIG. 12B is a cross-section view of the transmission module according to the third embodiment.
Figure 12C:
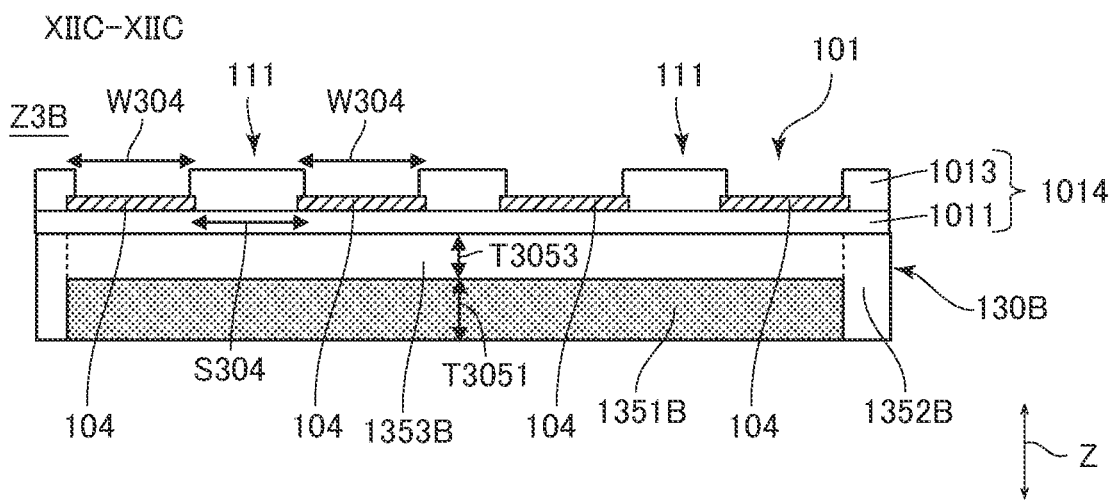
FIG. 12C is a cross-section view of the transmission module according to the third embodiment.

The transmission module 10B of the third embodiment includes the flexible printed wiring board 101, the connector 109, and the connector 120 described in the first embodiment. To be noted, in FIGS. 11A and 11B, the flexible printed wiring board 101 is stretched straight. FIG. 12A is a cross-section view of the transmission module 100B taken along a line XIIA-XIIA of FIG. 11A. FIG. 12B is a cross-section view of the transmission module 100B taken along a line XIIB-XIIB of FIG. 1A. FIG. 12C is a cross-section view of the transmission module 100B taken along a line XIIC-XIIC of FIG. 11A. To be noted, in FIG. 12C, illustration of the connector 109 is omitted.

The flexible printed wiring board 101 includes a plurality of signal lines 110 used for transmission of the digital signal D2. Among the plurality of signal lines 110, a pair of adjacent signal lines 110 constitute a differential line pair III that is a transmission path used for transmitting a differential signal. The signal lines 110 each include the wiring portion 102, the wiring portion 103, the pad 104, the wiring portion 105, and the pad 106.

The transmission module 100B of the third embodiment includes a reinforcing member 130B disposed at a position opposing the connector 109 with the flexible printed wiring board 101 therebetween. In addition, the transmission module 100B includes a reinforcing member 140B disposed at a position opposing the connector 120 with the flexible printed wiring board 101 therebetween.

The reinforcing member 130B includes insulating members 1351B, 1352B, and 1353B that are electrically insulating. The relative permittivity of the insulating member 1351B is higher than the relative permittivity of the insulating member 1352B. The insulating member 1353B is formed from the same material as the insulating member 1352B and has the same relative permittivity as the insulating member 1352B, but is thinner than the insulating member 1352B.

The reinforcing member 140B includes insulating members 1451B, 1452B, and 1453B that are electrically insulating. The relative permittivity of the insulating member 1451B is higher than the relative permittivity of the insulating member 1452B. The insulating member 1453B is formed from the same material as the insulating member 1452B and has the same relative permittivity as the insulating member 1452B, but is thinner than the insulating member 1452B.

The reinforcing member 130B is a member for reinforcing the flexible printed wiring board 101 to suppress breakage of the signal lines 110 when attaching or detaching the connector 109 to or from the connector 204. Therefore, the reinforcing member 130B is thicker than the flexible printed wiring board 101. Similarly, the reinforcing member 140B is a member for reinforcing the flexible printed wiring board 101 to suppress breakage of the signal lines 110 when attaching or detaching the connector 120 to or from the connector 305. Therefore, the reinforcing member 140B is thicker than the flexible printed wiring board 101. As viewed in the Z direction perpendicular to the main surface 1010 of the flexible printed wiring board 101, the reinforcing member 130B is disposed in a region including the entirety of the connector 109. In addition, as viewed in the Z direction, the reinforcing member 140B is disposed in a region including the entirety of the connector 120.

The configuration of the reinforcing member 140B is substantially the same as the configuration of the reinforcing member 130B. In addition, the positional relationship of the reinforcing member 140B with the connector 120, the wiring portion 105, and the pad 106 is substantially the same as the positional relationship of the reinforcing member 130B with the connector 109, the wiring portion 103, and the pad 104. Therefore, detailed description of the reinforcing member 140B will be omitted.

The insulating member 1351B of the reinforcing member 130B serves as an example of a first insulating member. The insulating member 1352B of the reinforcing member 130B serves as an example of a second insulating member. The insulating member 1353B of the reinforcing member 130B serves as an example of a third insulating member.

The insulating member 1352B is formed in a uniformly constant thickness in a direction parallel to the main surface 1010. Examples of the material of the insulating member 1352B include resins such as polyimide, PET, and glass epoxy, and among the resins, glass epoxy, which has high rigidity, is particularly preferable. The material of the insulating member 1351B is, for example, titanium oxide. The material of the insulating member 1353B is different from that of the insulating member 1351B, and is the same as that of the insulating member 1352B.

Among the plurality of pads 104, description will be given focusing on one pad 104. As viewed in the Z direction, the reinforcing member 130B includes a first portion P1B disposed in a region including at least part of the pad 104, and a second portion P2B disposed around the first portion P1B as viewed in the Z direction. It is preferable that the region of the first portion P1B includes 90% or more of the area of the pad 104 as viewed in the Z direction. In the third embodiment, as viewed in the Z direction, the first portion P1B is disposed in a region including the entirety of the pad 104.

Focusing on the plurality of the pads 104, that is, all the pads 104, the first portion P1B is disposed in a region including entirety of the plurality of pads 104 as viewed in the Z direction. Further, the second portion P2B is disposed around the first portion P1B so as to surround the first portion P1B as viewed in the Z direction.

Here, a differential signal is transmitted through the pair of signal lines 110 of the differential line pair 111. Therefore, the characteristic impedance Z1B of the wiring portion 102 described below is a differential impedance of the pair of wiring portions 102 in the differential line pair 111. In addition, the characteristic impedance Z2B of the wiring portion 103 is a differential impedance of the pair of wiring portions 103 in the differential line pair 111. In addition, the characteristic impedance Z3B of the pad 104 is a differential impedance of the pair of pads 104 in the differential line pair 111.

In the third embodiment, a member constituting the first portion P1B is a member having a nature that reduces the characteristic impedance Z3B of the pad 104 more than a member constituting the second portion P2B does.

Specifically, the first portion P1B is constituted by the insulating members 1351B and 1353B described above. As viewed in the Z direction, the insulating members 1351B and 1353B are laminated in the thickness direction of the flexible printed wiring board 101, that is, the Z direction. As viewed in the Z direction, the insulating members 1351B and 1353B each have the same shape and size as the first portion P1B.

In addition, the second portion P2B is constituted by the insulating member 1352B disposed around the insulating member 1351B. As viewed in the Z direction, the insulating member 1352B has the same shape and size as the second portion P2B. The relative permittivity of the insulating member 1353B is equal to the relative permittivity of the insulating member 1352B, and is different from the relative permittivity of the insulating member 1351B. In the third embodiment, the insulating member 1351B has a higher relative permittivity than the insulating members 1352B and 1353B.

As described above, in the third embodiment, the insulating members 1351B and 1353B formed from different materials are members constituting the first portion P1B. In addition, in the third embodiment, the insulating member 1352B formed from a different material from the insulating member 1351B is a member constituting the second portion P2B. The insulating member 1351B has a nature that reduces the characteristic impedance of an opposing conductor more than the insulating member 1352B does. The reinforcing member 130X of the comparative example is formed from the same material as and in the same thickness as the insulating member 1352B. Therefore, a characteristic impedance Z3B of the third embodiment is reduced more than the characteristic impedance Z3X of the comparative example. That is, since the laminate of the insulating members 1351B and 1353B is disposed to oppose the pad 104, the characteristic impedance Z3B of the pad 104 is reduced. As a result of this, the absolute value of the difference (Z3B−Z2B) between a characteristic impedance Z2B of the wiring portion 103 and the characteristic impedance Z3B of the pad 104 can be reduced. Therefore, in the signal line 110, generation of the reflection wave of the digital signal D2, that is, generation of the noise can be reduced, and thus the quality of the digital signal D2 transmitted through the signal line 110 can be improved.

A width W304 of the pad 104 is preferably larger than each of a width W302 of the wiring portion 102 and a width W303 of the wiring portion 103 for bonding the terminal 1091 of the connector 109 thereto. In addition, a distance S304 between the pair of pads 104 is preferably larger than each of a distance S302 between a pair of wiring portions 102 and a distance S303 between a pair of wiring portions 103 for bonding the terminal 1091 of the connector 109 thereto.

In addition, the width W303 of the wiring portion 103 is preferably equal to or less than the width W302 of the wiring portion 102. As viewed in the Z direction, the wiring portion 103 overlaps the second portion P2B of the reinforcing member 130B having a higher relative permittivity than the air. Therefore, the width W303 of the wiring portion 103 may be equal to the width W302 of the wiring portion 102 not overlapping the reinforcing member 130B, but is preferably smaller than the width W302. As a result of this, the characteristic impedance Z2B of the wiring portion 103 is higher than the characteristic impedance Z2X of the wiring portion 103X of the comparative example. Therefore, the absolute value of the difference (Z2B-Z1B) between a characteristic impedance Z1B of the wiring portion 102 and the characteristic impedance Z2B of the wiring portion 103 can be reduced. In addition, the absolute value of the difference (Z3B-Z2B) between the characteristic impedance Z2B of the wiring portion 103 and the characteristic impedance Z3B of the pad 104 can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, the distance S303 between a pair of the wiring portions 103 is preferably equal to or larger than the distance S302 between a pair of the wiring portions 102. As viewed in the Z direction, the pair of the wiring portions 103 overlaps the second portion P2B of the reinforcing member 130B having a higher relative permittivity than the air. Therefore, the distance S303 between the pair of the wiring portions 103 may be equal to the distance S302 of the pair of the wiring portions 102 not overlapping the reinforcing member 130B, but is preferably larger than the distance S302. As a result of this, the characteristic impedance Z2B is higher than the characteristic impedance Z2X of the comparative example. Therefore, the absolute value of the difference (Z2B-Z1B) between the characteristic impedance Z1B and the characteristic impedance Z2B and the absolute value of the difference (Z3B-Z2B) between the characteristic impedance Z2B and the characteristic impedance Z3B can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, as viewed in the Z direction, although the wiring portion 103 may partially overlap the first portion P1B, since the first portion P1B has a nature that reduces the characteristic impedance of an opposing conductor, it is preferable that the wiring portion 103 does not overlap the first portion P1B. As a result of this, reduction of the characteristic impedance Z2B of the wiring portion 103 can be suppressed, and the absolute value of the difference (Z2B-Z1B) and the absolute value of the difference (Z3B-Z2B) can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

To be noted, although the reinforcing member 130B has been described, since the reinforcing member 140B has substantially the same configuration as the reinforcing member 130B, the quality of the digital signal D2 transmitted through the signal line 110 can be more effectively improved.

In addition, the first portion P1B may further include the conductive member 136 having substantially the same configuration as in the first embodiment.

Example 3

Simulation of differential impedance was performed for the transmission module 100B according to the third embodiment. HyperLynx available from Mentor Graphics was used for the simulation of the differential impedance.

The thickness of the base layer 1011 is denoted by T3011, the thickness of the conductor layer 1012 is denoted by T3012, and the thickness of a portion of the cover layer 1013 overlapping the signal line 110 on the conductor layer 1012 is denoted by T3013. In addition, the thickness of the reinforcing member 130B, that is, the thickness of the insulating member 1352B is denoted by T305. The thickness of the insulating member 1351B is denoted by T3051, and the thickness of the insulating member 1353B is denoted by T3053. The sum of the thickness T3051 and the thickness T3053 equals to the thickness T305. In the simulation, parameter values of the respective thicknesses were as follows: T3011=12.5 μm; T3012=12 μm; T3013=27.5 μm; T305=415 μm; T3053=100 μm; and T3051=315 μm. To be noted, the thickness T305 of the reinforcing member 130B and the thickness T3053 of the insulating member 1353B includes a thickness of 15 μm of an adhesive between the reinforcing member 130B and the base layer 1011. The relative permittivity of the base layer 1011 was set to 3.3, the relative permittivity of the cover layer 1013 was set to 3.6, the relative permittivity of the insulating members 1352B and 1353B was set to 4.7, and the relative permittivity of the adhesive was set to 4.0. The relative permittivity of the insulating member 1351B was set to 30. The conductivity of the signal line 110 was set to $1.724 \times 10^{-8}$ Ωm.

The width of the wiring portion 102 is denoted by W302, the width of the wiring portion 103 is denoted by W303, and the width of the pad 104 is denoted by W304. In addition, the distance between a pair of the wiring portions 102 in the differential line pair 111 is denoted by S302, the distance between a pair of the wiring portions 103 in the differential line pair 111 is denoted by S303, and the distance between a pair of the pads 104 in the differential line pair 111 is denoted by S304. In the simulation, the values of the widths and the distances were as follows: W302=150 μm; S302=45 μm: W303=130 μm: S303=65 μm; W304=250 μm; and S304=150 μm. As described above, in Example 3. W304>W302>W303 and S304>S303>S302 hold.

In Example 3, the characteristic impedance (differential impedance) Z1B of the wiring portion 102 was 103.8Ω. The characteristic impedance (differential impedance) Z2B of the wiring portion 103 was 100.0Ω. The characteristic impedance (differential impedance) Z3B of the pad 104 was 100.8Ω.

In Comparative Example 1, the difference (Z3X-Z2X) in the characteristic impedance was 32.7Ω. In contrast, in Example 3, the difference (Z3B-Z2B) in the characteristic impedance was 0.8Ω. Therefore, the absolute value |Z3B-Z2B| of the difference in the characteristic impedance of Example 3 was smaller than the absolute value |Z3X-Z2X| of the difference in the characteristic impedance of Comparative Example 1, which indicates that the characteristic impedance was more consistent in Example 3 than in Comparative Example 1. Therefore, in Example 3, generation of the reflection wave can be reduced.

In Comparative Example 1, the difference (Z2X-Z1X) in the characteristic impedance was −18.3Ω. In contrast, in Example 3, the difference (Z2B-Z1B) in the characteristic impedance was −3.8Ω. Therefore, the absolute value |Z2B-Z1B| of the difference in the characteristic impedance of Example 3 was smaller than the absolute value |Z2X-Z1X| of the difference in the characteristic impedance of Comparative Example 1, which indicates that the characteristic impedance was more consistent in Example 3 than in Comparative Example 1. Therefore, in Example 3, generation of the reflection wave can be reduced.

Fourth Embodiment

Figure 13A:
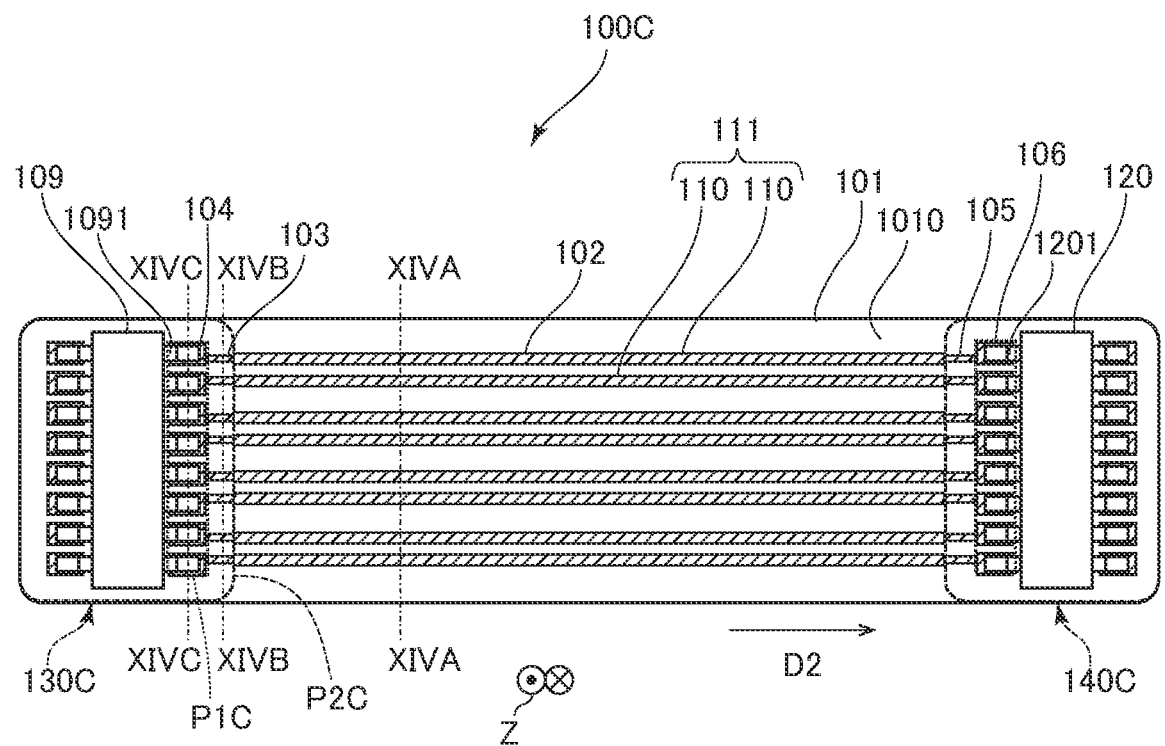
FIG. 13A is a plan view of a transmission module according to a fourth embodiment.
Figure 13B:
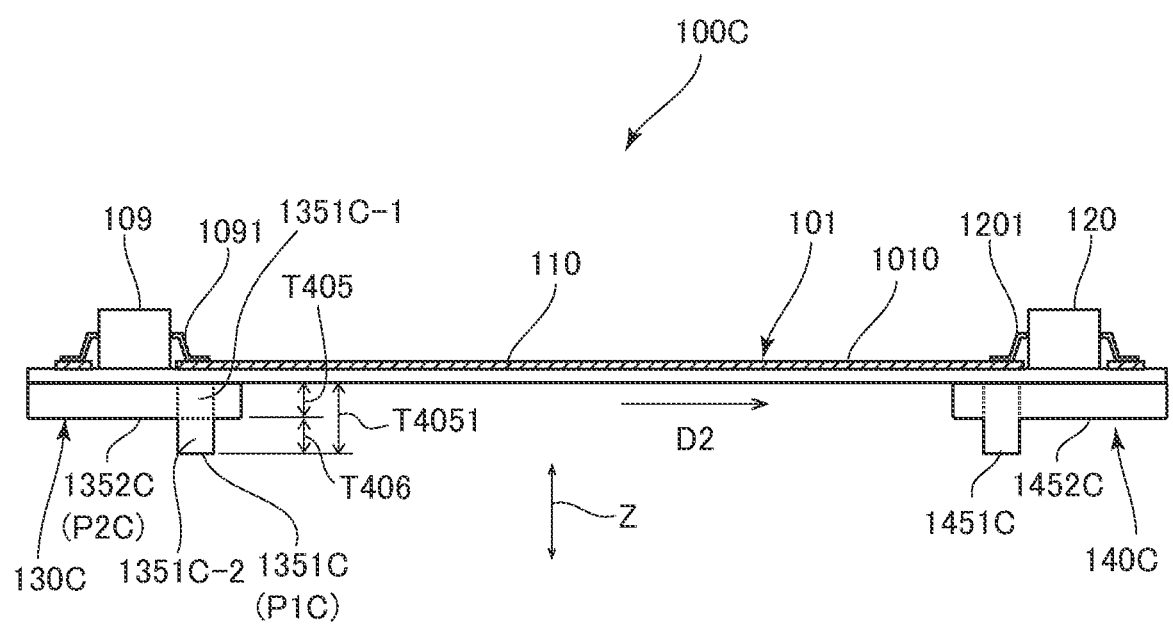
FIG. 13B is a longitudinal section view of the transmission module according to the fourth embodiment.

Next, a transmission module of a fourth embodiment will be described. FIG. 13A is a plan view of a transmission module 100C according to the fourth embodiment. FIG. 13B is a longitudinal section view of the transmission module 100C according to the fourth embodiment. FIGS. 13A and 13B schematically illustrate the transmission module 100C. In the fourth embodiment, the transmission module 100C is applied to the electronic unit 500 instead of the transmission module 100 of the first embodiment. Therefore, description of elements substantially the same as in the first embodiment will be omitted.

Figure 14A:
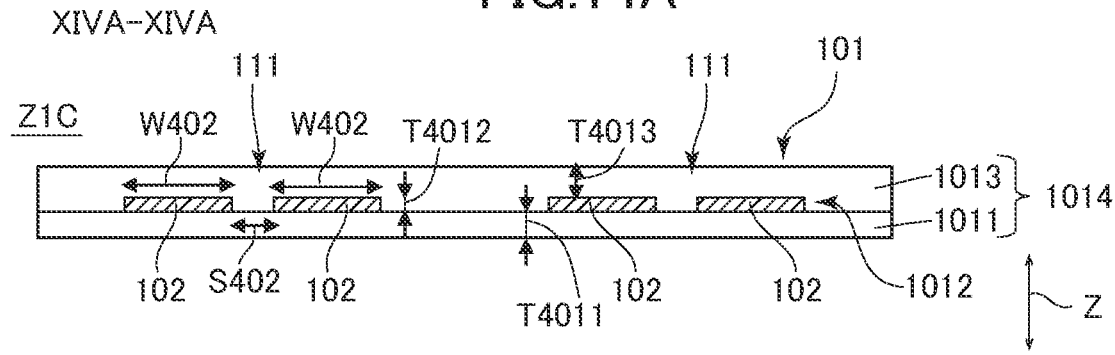
FIG. 14A is a cross-section view of the transmission module according to the fourth embodiment.
Figure 14B:
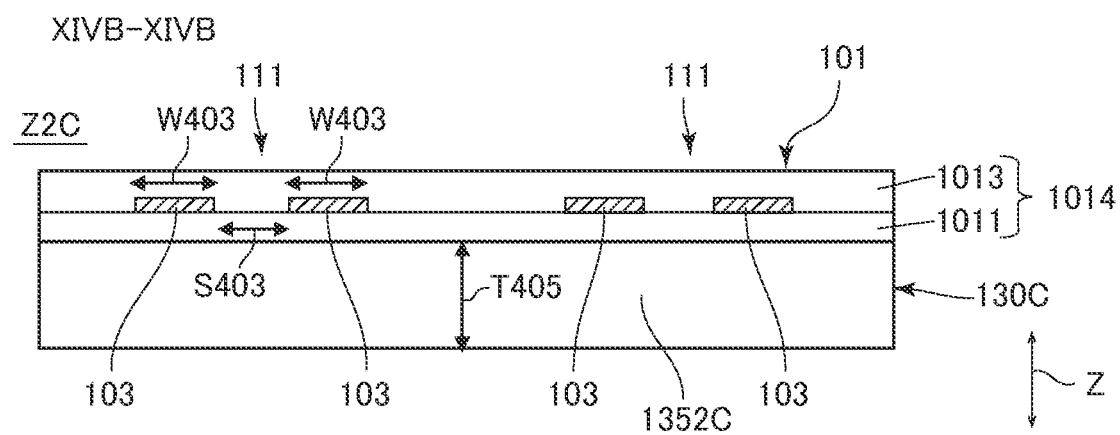
FIG. 14B is a cross-section view of the transmission module according to the fourth embodiment.
Figure 14C:
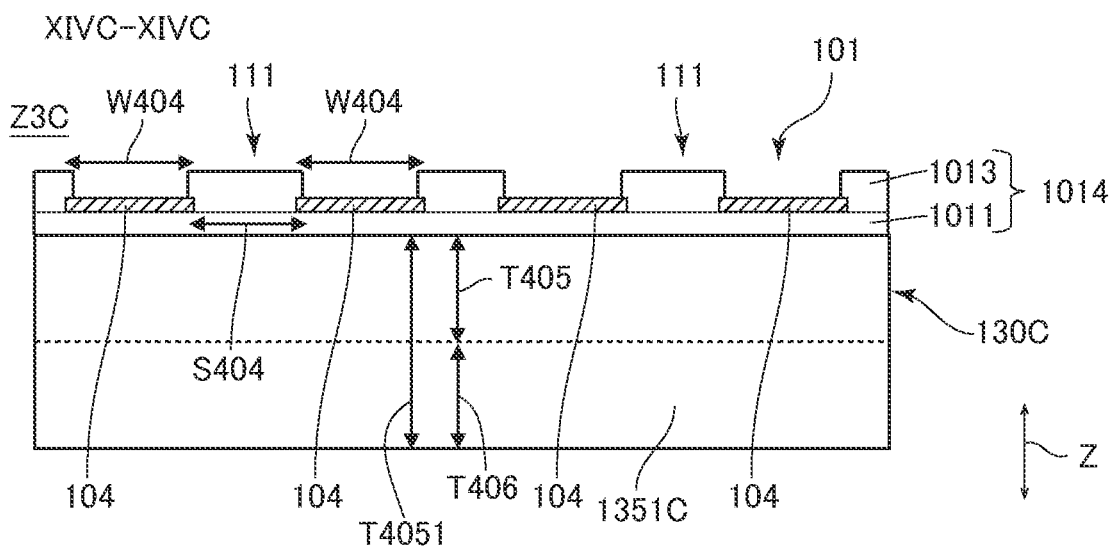
FIG. 14C is a cross-section view of the transmission module according to the fourth embodiment.

The transmission module 100C of the fourth embodiment includes the flexible printed wiring board 101, the connector 109, and the connector 120 described in the first embodiment. To be noted, in FIGS. 13A and 13B, the flexible printed wiring board 101 is stretched straight. FIG. 14A is a cross-section view of the transmission module 100C taken along a line XIVA-XIVA of FIG. 13A. FIG. 14B is a cross-section view of the transmission module 100C taken along a line XIVB-XIVB of FIG. 13A. FIG. 14C is a cross-section view of the transmission module 100C taken along a line XIVC-XIVC of FIG. 13A. To be noted, in FIG. 14C, illustration of the connector 109 is omitted.

The flexible printed wiring board 101 includes a plurality of signal lines 110 used for transmission of the digital signal D2. Among the plurality of signal lines 110, pairs of adjacent signal lines 110 each constitute a differential line pair 111 that is a transmission path used for transmitting a differential signal. The signal lines 110 each include the wiring portion 102, the wiring portion 103, the pad 104, the wiring portion 105, and the pad 106.

The transmission module 100C of the fourth embodiment includes a reinforcing member 130C disposed at a position opposing the connector 10) with the flexible printed wiring board 101 therebetween. In addition, the transmission module 100C includes a reinforcing member 140C disposed at a position opposing the connector 120 with the flexible printed wiring board 101 therebetween.

The reinforcing member 130C includes insulating members 1351C and 1352C that are electrically insulating. The relative permittivity of the insulating member 1351C is equal to the relative permittivity of the insulating member 1352C. The insulating member 1351C is disposed at a position opposing the plurality of pads 104. The insulating member 1351C is thicker than the insulating member 1352C.

The reinforcing member 140C includes insulating members 1451C and 1452C that are electrically insulating. The relative permittivity of the insulating member 1451C is equal to the relative permittivity of the insulating member 1452C. The insulating member 1451C is disposed at a position opposing the plurality of pads 106. The insulating member 1451C is thicker than the insulating member 1452C.

The reinforcing member 130C is a member for reinforcing the flexible printed wiring board 101 to suppress breakage of the signal lines 110 when attaching or detaching the connector 109 to or from the connector 204. Therefore, the insulating member 1352C of the reinforcing member 130C is thicker than the flexible printed wiring board 101. Similarly, the reinforcing member 140C is a member for reinforcing the flexible printed wiring board 101 to suppress breakage of the signal lines 110 when attaching or detaching the connector 120 to or from the connector 305. Therefore, the insulating member 1452C of the reinforcing member 140C is thicker than the flexible printed wiring board 101. As viewed in the Z direction perpendicular to the main surface 1010 of the flexible printed wiring board 101, the reinforcing member 130C is disposed in a region including the entirety of the connector 109. In addition, as viewed in the Z direction, the reinforcing member 140C is disposed in a region including the entirety of the connector 120.

The configuration of the reinforcing member 140C is substantially the same as the configuration of the reinforcing member 130C. In addition, the positional relationship of the reinforcing member 140C with the connector 120, the wiring portion 105, and the pad 106 is substantially the same as the positional relationship of the reinforcing member 130C with the connector 109, the wiring portion 103, and the pad 104. Therefore, detailed description of the reinforcing member 140C will be omitted.

The insulating member 1351C of the reinforcing member 130C serves as an example of a first insulating member. The insulating member 1352C of the reinforcing member 130C serves as an example of a second insulating member.

The insulating member 1352C is formed in a uniformly constant thickness in a direction parallel to the main surface 1010. Examples of the material of the insulating member 1352C include resins such as polyimide. PET, and glass epoxy, and among the resins, glass epoxy, which has high rigidity, is particularly preferable. The insulating member 1351C is formed from the same material as the insulating member 1352C. By using the same material for the insulating members 1351C and 1352C, the manufacturing cost can be reduced.

Among the plurality of pads 104, description will be given focusing on one pad 104. As viewed in the Z direction, the reinforcing member 130C includes a first portion P1C disposed in a region including at least part of the pad 104, and a second portion P2C disposed around the first portion P1C as viewed in the Z direction. It is preferable that the region of the first portion P1C includes 90% or more of the area of the pad 104 as viewed in the Z direction. In the fourth embodiment, as viewed in the Z direction, the first portion P1C is disposed in a region including the entirety of the pad 104.

Focusing on the plurality of pads 104, that is, all the pads 104, the first portion P1C is disposed in a region including the entirety of the plurality of pads 104 as viewed in the Z direction. Further, the second portion P2C is disposed around the first portion P1C so as to surround the first portion P1C as viewed in the Z direction.

Here, a differential signal is transmitted through the pair of signal lines 110 of the differential line pair 111. Therefore, a characteristic impedance Z1C of the wiring portion 102 described below is a differential impedance of the pair of wiring portions 102 in the differential line pair 111. In addition, a characteristic impedance Z2C of the wiring portion 103 is a differential impedance of the pair of wiring portions 103 in the differential line pair 111. In addition, a characteristic impedance Z3C of the pad 104 is a differential impedance of the pair of pads 104 in the differential line pair 111.

In the fourth embodiment, a member constituting the first portion P1C is a member having a nature that reduces the characteristic impedance Z3C of the pad 104 more than a member constituting the second portion P2C does.

Specifically, the first portion P1C is constituted by the insulating member 1351C described above. As viewed in the Z direction, the insulating member 1351C has the same shape and size as the first portion P1C. In addition, the second portion P2C is constituted by the insulating member 1352C disposed around the insulating member 1351C. As viewed in the Z direction, the insulating member 1352C has the same shape and size as the second portion P2C. The insulating member 1351C has the same relative permittivity as the insulating member 1352C.

To be noted, although the insulating member 1351C may be formed integrally with the insulating member 1352C, the insulating member 1351C may be divided into two portions 1351C-1 and 1351C-2 in view of ease of manufacture thereof. In this case, the portions 1351C-1 and 1351C-2 may be joined using an adhesive. In addition, in this case, the insulating member 1352C may be integrally formed with the portion 1351C-1.

As described above, in the fourth embodiment, the insulating member 1351C is a member constituting the first portion P1C. In addition, in the fourth embodiment, the insulating member 1352C is a member constituting the second portion P2C. In addition, the insulating member 1351C is thicker than the insulating member 1352C. Therefore, the insulating member 1351C has a nature that reduces the characteristic impedance of an opposing conductor more than the insulating member 1352C does. The reinforcing member 130X of the comparative example is formed from the same material as and in the same thickness as the insulating member 1352C. Therefore, the characteristic impedance Z3C of the fourth embodiment is reduced more than the characteristic impedance Z3X of the comparative example. That is, since the insulating member 1351C is disposed to oppose the pad 104, the characteristic impedance Z3C of the pad 104 is reduced. As a result of this, the absolute value of the difference (Z3C-Z2C) between the characteristic impedance Z2C of the wiring portion 103 and the characteristic impedance Z3C of the pad 104 can be reduced. Therefore, in the signal line 110, generation of the reflection wave of the digital signal D2, that is, generation of the noise can be reduced, and thus the quality of the digital signal D2 transmitted through the signal line 110 can be improved.

A width W404 of the pad 104 is preferably larger than each of a width W402 of the wiring portion 102 and a width W403 of the wiring portion 103 for bonding the terminal 1091 of the connector 109 thereto. In addition, a distance S404 between the pair of pads 104 is preferably larger than each of a distance S402 between a pair of wiring portions 102 and a distance S403 between a pair of wiring portions 103 for bonding the terminal 1091 of the connector 109 thereto.

In addition, the width W403 of the wiring portion 103 is preferably equal to or less than the width W402 of the wiring portion 102. As viewed in the Z direction, the wiring portion 103 overlaps the second portion P2C of the reinforcing member 130C having a higher relative permittivity than the air. Therefore, the width W403 of the wiring portion 103 may be equal to the width W402 of the wiring portion 102 not overlapping the reinforcing member 130C, but is preferably smaller than the width W402. As a result of this, the characteristic impedance Z2C of the wiring portion 103 is higher than the characteristic impedance Z2X of the wiring portion 103X of the comparative example. Therefore, the absolute value of the difference (Z2C-Z1C) between the characteristic impedance Z1C of the wiring portion 102 and the characteristic impedance Z2C of the wiring portion 103 can be reduced. In addition, the absolute value of the difference (Z3C-Z2C) between the characteristic impedance Z2C of the wiring portion 103 and the characteristic impedance Z3C of the pad 104 can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, the distance S403 between a pair of the wiring portions 103 is preferably equal to or larger than the distance S402 between a pair of the wiring portions 102. As viewed in the Z direction, the pair of the wiring portions 103 overlaps the second portion P2C of the reinforcing member 130C having a higher relative permittivity than the air. Therefore, the distance S403 between the pair of the wiring portions 103 may be equal to the distance S402 of the pair of the wiring portions 102 not overlapping the reinforcing member 130C, but is preferably larger than the distance S402. As a result of this, the characteristic impedance Z2C is higher than the characteristic impedance Z2X of the comparative example. Therefore, the absolute value of the difference (Z2C-Z1C) between the characteristic impedance Z1C and the characteristic impedance Z2C and the absolute value of the difference (Z3C-Z2C) between the characteristic impedance Z2C and the characteristic impedance Z3C can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

In addition, as viewed in the Z direction, although the wiring portion 103 may partially overlap the first portion P1C, since the first portion P1C has a nature that reduces the characteristic impedance of an opposing conductor, it is preferable that the wiring portion 103 does not overlap the first portion P1C. As a result of this, reduction of the characteristic impedance Z2C of the wiring portion 103 can be suppressed, and the absolute value of the difference (Z2C-Z1C) and the absolute value of the difference (Z3C-Z2C) can be reduced. Therefore, in the signal line 110, generation of the reflection wave of the digital signal D2, that is, generation of the noise can be more effectively reduced, and the quality of the digital signal D2 transmitted through the signal line 110 can be more effectively improved.

To be noted, although the reinforcing member 130C has been described, since the reinforcing member 140C has substantially the same configuration as the reinforcing member 130C, the quality of the digital signal D2 transmitted through the signal line 110 can be more effectively improved.

In addition, the first portion P1C may further include the conductive member 136 having substantially the same configuration as in the first embodiment. In addition, part or the entirety of the insulating member 1351C included in the first portion P1C may be formed from a material having a higher relative permittivity than the insulating member 1352C.

Example 4

Simulation of differential impedance was performed for the transmission module 100C according to the fourth embodiment. HyperLynx available from Mentor Graphics was used for the simulation of the differential impedance.

The thickness of the base layer 1011 is denoted by T4011, the thickness of the conductor layer 1012 is denoted by T4012, and the thickness of a portion of the cover layer 1013 overlapping the signal line 110 on the conductor layer 1012 is denoted by T4013. In addition, the thickness of the insulating member 1352C of the reinforcing member 130C is denoted by T405. The thickness of the portion 1351C-1 is also denoted by T405. The thickness of the insulating member 1351C is denoted by T4051. The thickness of the portion 1351C-2, which is a projecting portion, that is obtained by subtracting the thickness T405 from the thickness T4051 of the insulating member 1351C is denoted by T406. In the simulation, parameter values of the respective thicknesses were as follows: T4011=12.5 μm; T4012=12 μm; T4013=27.5 μm; T405=415 μm, and T406=415 μm. To be noted, the thickness T405 of the insulating member 1352C includes a thickness of 15 μm of an adhesive between the insulating member 1352C and the base layer 1011. The thickness T406 of the portion 1351C-2 includes a thickness of 15 μm between the portion 1351C-1 and the portion 1351C-2. The relative permittivity of the base layer 1011 was set to 3.3, the relative permittivity of the cover layer 1013 was set to 3.6, the relative permittivity of the portions 1351C-1 and 1351C-2 and the insulating member 1352C was set to 4.7, and the relative permittivity of the adhesive was set to 4.0. The conductivity of the signal line 110 was set to $1.724 \times 10^{-8}$ Ωm.

The width of the wiring portion 102 is denoted by W402, the width of the wiring portion 103 is denoted by W403, and the width of the pad 104 is denoted by W404. In addition, the distance between a pair of the wiring portions 102 in the differential line pair 111 is denoted by S402, the distance between a pair of the wiring portions 103 in the differential line pair 111 is denoted by S403, and the distance between a pair of the pads 104 in the differential line pair 111 is denoted by S404. In the simulation, the values of the widths and the distances were as follows: W402=150 μm: S402=45 μm; W403=130 μm; S403=65 μm; W404=290 μm: and S404=110 μm. As described above, in Example 4, W404>W402>W403 and S404>S403>S402 hold.

In Example 4, the characteristic impedance (differential impedance) Z1C of the wiring portion 102 was 103.8Ω. The characteristic impedance (differential impedance) Z2C of the wiring portion 103 was 100.0Ω. The characteristic impedance (differential impedance) Z3C of the pad 104 was 99.7Ω.

In Comparative Example 1, the difference (Z3X-Z2X) in the characteristic impedance was 32.7Ω. In contrast, in Example 4, the difference (Z3C-Z2C) in the characteristic impedance was −0.3Ω. Therefore, the absolute value |Z3C-Z2C| of the difference in the characteristic impedance of Example 4 was smaller than the absolute value |Z3X-Z2X| of the difference in the characteristic impedance of Comparative Example 1, which indicates that the characteristic impedance was more consistent in Example 4 than in Comparative Example 1. Therefore, in Example 4, generation of the reflection wave can be reduced.

In Comparative Example 1, the difference (Z2X-Z1X) in the characteristic impedance was −18.3Ω. In contrast, in Example 4, the difference (Z2C-Z1C) in the characteristic impedance was −3.8Ω. Therefore, the absolute value |Z2C-Z1C| of the difference in the characteristic impedance of Example 4 was smaller than the absolute value |Z2X-Z1X| of the difference in the characteristic impedance of Comparative Example 1, which indicates that the characteristic impedance was more consistent in Example 4 than in Comparative Example 1. Therefore, in Example 4, generation of the reflection wave can be reduced.

Fifth Embodiment

Figure 15A:
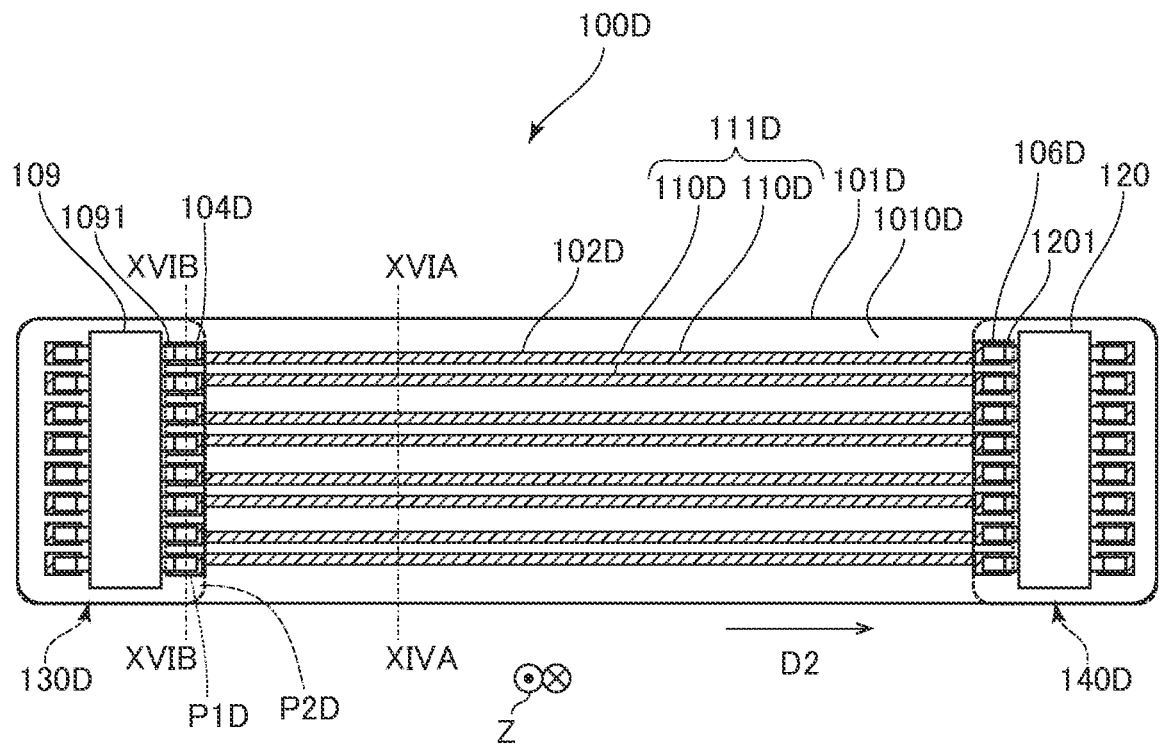
FIG. 15A is a plan view of a transmission module according to a fifth embodiment.
Figure 15B:
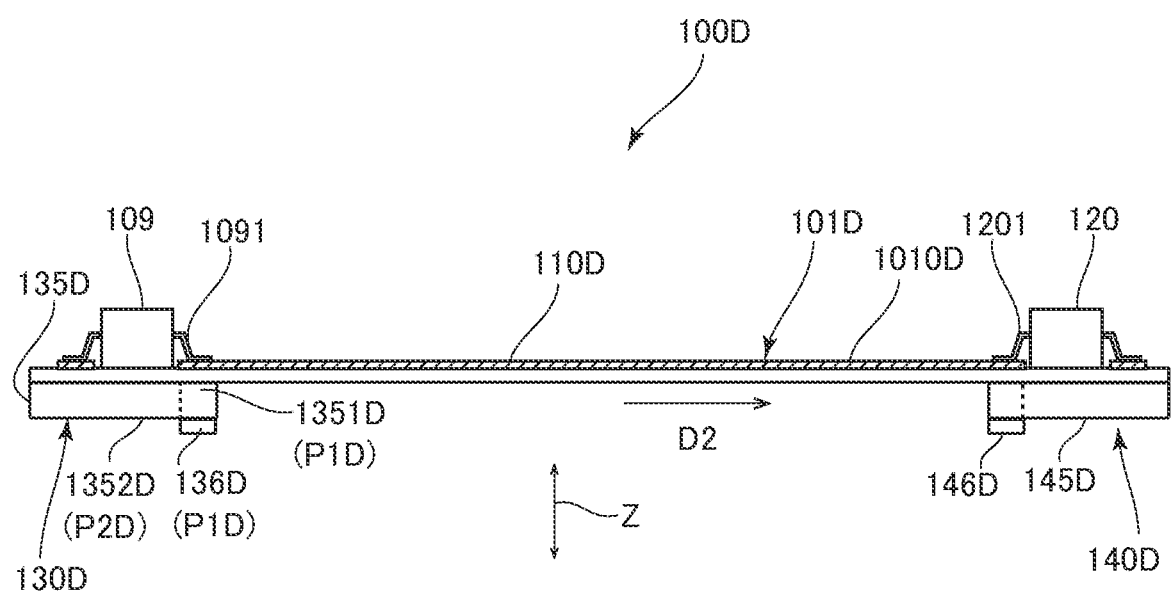
FIG. 15B is a longitudinal section view of the transmission module according to the fifth embodiment.

Next, a transmission module of a fifth embodiment will be described. FIG. 15A is a plan view of a transmission module 100D according to the fifth embodiment. FIG. 15B is a longitudinal section view of the transmission module 100D according to the fifth embodiment. FIGS. 15A and 15B schematically illustrate the transmission module 100D. In the fifth embodiment, the transmission module 100D is applied to the electronic unit 500 instead of the transmission module 100 of the first embodiment. Therefore, description of elements substantially the same as in the first embodiment will be omitted.

Figure 16A:
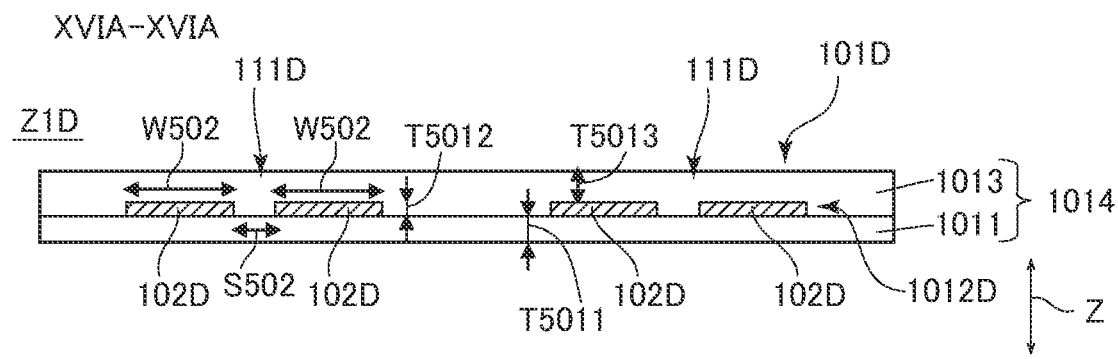
FIG. 16A is a cross-section view of the transmission module according to the fifth embodiment.
Figure 16B:
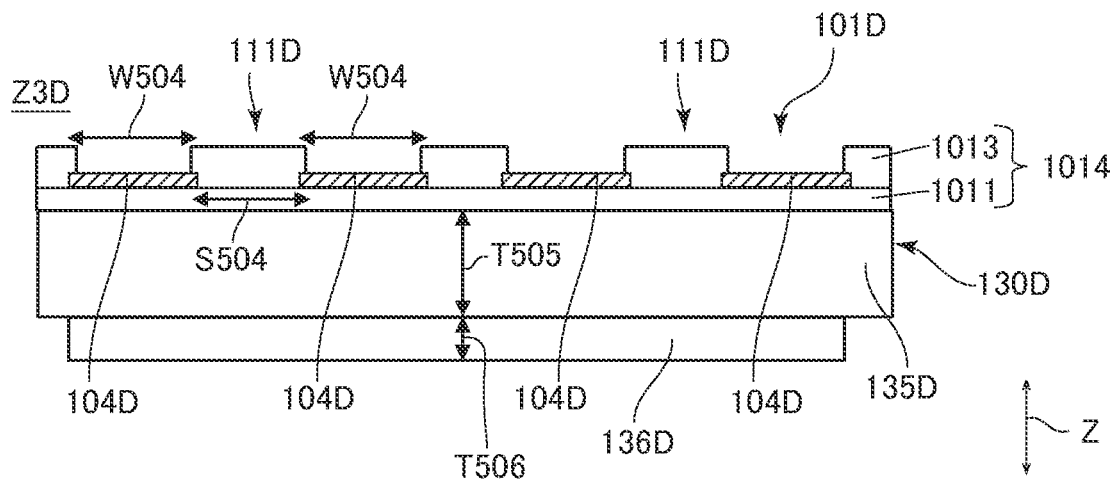
FIG. 16B is a cross-section view of the transmission module according to the fifth embodiment.

The transmission module 100D of the fifth embodiment includes a flexible printed wiring board 101D, and the connector 109 and the connector 120 described in the first embodiment. To be noted, in FIGS. 15A and 15B, the flexible printed wiring board 101D is stretched straight. FIG. 16A is a cross-section view of the transmission module 100D taken along a line XVIA-XVIA of FIG. 15A. FIG. 16B is a cross-section view of the transmission module 100D taken along a line XVIB-XVIB of FIG. 15A. To be noted, in FIG. 16B, illustration of the connector 109 is omitted.

The flexible printed wiring board 101D includes a plurality of signal lines 110D used for transmission of the digital signal D2. Among the plurality of signal lines 110D, pairs of adjacent signal lines 110D each constitute a differential line pair 111D that is a transmission path used for transmitting a differential signal. Due to increase in the size of the image data, the digital signal D2 is transmitted at a transmission speed of 10 Gbps or more per one differential line pair 111D. The signal lines 110D are each formed from a metal foil such as a copper foil.

The flexible printed wiring board 101D includes the insulating layer 1014 that is described in the first embodiment that supports the plurality of signal lines 110D. The insulating layer 1014 includes the base layer 1011 and the cover layer 1013. The plurality of signal lines 110D are disposed in a conductor layer 1012D on the base layer 1011. The base layer 1011 and the cover layer 1013 are formed from, for example, polyimide.

The transmission module 100D of the fifth embodiment includes a reinforcing member 130D disposed at a position opposing the connector 109 with the flexible printed wiring board 101D therebetween. In addition, the transmission module 100D includes a reinforcing member 140D disposed at a position opposing the connector 120 with the flexible printed wiring board 101D therebetween. The reinforcing member 130D includes an insulating layer 135D that is electrically insulating. The reinforcing member 140D includes an insulating layer 145D that is electrically insulating. The reinforcing member 130D is a member for reinforcing the flexible printed wiring board 101D to suppress breakage of the signal lines 110D when attaching or detaching the connector 109 to or from the connector 204. Therefore, the insulating layer 135D of the reinforcing member 130D is thicker than the flexible printed wiring board 101D. Similarly, the reinforcing member 140D is a member for reinforcing the flexible printed wiring board 101D to suppress breakage of the signal lines 110D when attaching or detaching the connector 120 to or from the connector 305. Therefore, the insulating layer 145D of the reinforcing member 140D is thicker than the flexible printed wiring board 101D. As viewed in the Z direction perpendicular to a main surface 1010D of the flexible printed wiring board 101D, the reinforcing member 130D is disposed in a region including the entirety of the connector 109. In addition, as viewed in the Z direction, the reinforcing member 140D is disposed in a region including the entirety of the connector 120.

The signal line 110D includes a wiring portion 102D as a main line, and a pad 104D connected to the wiring portion 102D. The wiring portion 102D serves as an example of a first wiring portion, and is disposed at a position not overlapping the reinforcing member 130D as viewed in the Z direction. The pad 104D is disposed in a region overlapping the reinforcing member 130D as viewed in the Z direction. The pad 104D is bonded to the terminal 1091 of the connector 109 via solder or the like.

In addition, the signal line 110D includes a pad 106D connected to the wiring portion 102D. The pad 106D is disposed in a region overlapping the reinforcing member 140D as viewed in the Z direction. The pad 106D is bonded to the terminal 1201 of the connector 120 via solder or the like.

In the fifth embodiment, the reinforcing member 130D includes a conductive member 136D disposed on the insulating layer 135D. In addition, in the fifth embodiment, the reinforcing member 140D includes a conductive member 146D disposed on the insulating layer 145D.

The configuration of the reinforcing member 140D is substantially the same as the reinforcing member 130D. In addition, the positional relationship of the reinforcing member 140D with the connector 120, the wiring portion 102D, and the pad 106D is substantially the same as the positional relationship of the reinforcing member 130D with the connector 109, the wiring portion 102D, and the pad 104D. Therefore, detailed description of the reinforcing member 140D will be omitted.

The insulating layer 135D of the reinforcing member 130D is formed in a uniformly constant thickness in a direction parallel to the main surface 1010D. Examples of the material of the insulating layer 135D include resins such as polyimide, PET, and glass epoxy, and among the resins, glass epoxy, which has high rigidity, is particularly preferable. The conductive member 136D of the reinforcing member 130D is disposed on the insulating layer 135D. The conductive member 136D is a metal foil such as a copper foil. The conductive member 136D may be electrically connected to an unillustrated ground terminal of the connector 109.

Among the plurality of pads 104D, description will be given focusing on one pad 104D. As viewed in the Z direction, the reinforcing member 130D includes a first portion P1D disposed in a region including at least part of the pad 104D, and a second portion P2D disposed around the first portion P1D as viewed in the Z direction. It is preferable that the region of the first portion P1D includes 90% or more of the area of the pad 104D as viewed in the Z direction. In the fifth embodiment, as viewed in the Z direction, the first portion P1D is disposed in a region including the entirety of the pad 104D.

Focusing on the plurality of the pads 104D, that is, all the pads 104D, the first portion P1D is disposed in a region including entirety of the plurality of pads 104D as viewed in the Z direction. Further, the second portion P2D is disposed around the first portion P1D so as to surround the first portion P1D as viewed in the Z direction.

Here, a differential signal is transmitted through the pair of signal lines 110D of the differential line pair 111D. Therefore, a characteristic impedance Z1D of the wiring portion 102D described below is a differential impedance of the pair of wiring portions 102D in the differential line pair 111D. In addition, a characteristic impedance Z3D of the pad 104D is a differential impedance of the pair of pads 104D in the differential line pair 111D.

In the fifth embodiment, a member constituting the first portion P1D is a member having a nature that reduces the characteristic impedance Z3D of the pad 104D more than a member constituting the second portion P2D does.

Specifically, the first portion P1D is constituted by an insulating member 1351D that is part of the insulating layer 135D, and the conductive member 136D disposed on the insulating member 1351D. As viewed in the Z direction, the insulating member 1351D and the conductive member 136D each have the same shape and size as the first portion P1D. In addition, the second portion P2D is constituted by an insulating member 1352D that is part of the insulating layer 135D and disposed around the insulating member 1351D. As viewed in the Z direction, the insulating member 1352D has the same shape and size as the second portion P2D. The insulating member 1351D serves as an example of a first insulating member. The insulating member 1352D serves as an example of a second insulating member. The insulating member 1351D is formed from the same material as the insulating member 1352D and in the same thickness as the insulating member 1352D, and has the same relative permittivity as the insulating member 1352D.

As described above, in the fifth embodiment, the insulating member 1351D and the conductive member 136D are members constituting the first portion P1D. In addition, in the fifth embodiment, the insulating member 1352D having the same relative permittivity and the same thickness as the insulating member 1351D is a member constituting the second portion P2D. The member constituted by the insulating member 1351D and the conductive member 136D has a nature that reduces the characteristic impedance of an opposing conductor more than the member constituted by the insulating member 1352D does. Since the reinforcing member 130X of the comparative example has substantially the same configuration as the insulating layer 135D, the characteristic impedance Z3D of the fifth embodiment is reduced more than the characteristic impedance Z3X of the comparative example. That is, since the conductive member 136D is disposed to oppose the pad 104D with the insulating member 1351D therebetween, the characteristic impedance Z3D of the pad 104D is reduced. As a result of this, the absolute value of the difference (Z3D−Z1D) between the characteristic impedance Z1D of the wiring portion 102D and the characteristic impedance Z3D of the pad 104D can be reduced. Therefore, in the signal line 110D, generation of the reflection wave of the digital signal D2, that is, generation of the noise can be reduced, and thus the quality of the digital signal D2 transmitted through the signal line 110D can be improved.

A width W504 of the pad 104D is preferably larger than the width W502 of the wiring portion 102D for bonding the terminal 1091 of the connector 109 thereto. In addition, a distance S504 between the pair of pads 104D is preferably larger than a distance S502 between a pair of wiring portions 102D for bonding the terminal 1091 of the connector 109 thereto.

To be noted, although a case where the first portion P1D of the fifth embodiment has substantially the same configuration as the first portion P1 of the first embodiment has been described, the configuration is not limited to this. For example, the first portion P1D of the fifth embodiment may be configured in substantially the same manner as one of the first portions P1A to P1C of the second to fourth embodiments.

In addition, whereas the reinforcing member 130D has been described, the reinforcing member 140D has substantially the same configuration as the reinforcing member 130D, and therefore the quality of the digital signal D2 transmitted through the signal line 110D can be more effectively improved.

Example 5

Simulation of differential impedance was performed for the transmission module 100D according to the fifth embodiment. HyperLynx available from Mentor Graphics was used for the simulation of the differential impedance.

The thickness of the base layer 1011 is denoted by T5011, the thickness of the conductor layer 1012D is denoted by T5012, the thickness of a portion of the cover layer 1013 overlapping the signal line 110D on the conductor layer 1012D is denoted by T5013. In addition, the thickness of the insulating layer 135D of the reinforcing member 130D is denoted by T505, and the thickness of the conductive member 136D is denoted by T506. In the simulation, parameter values of the respective thicknesses were as follows: T5011=12.5 µm; T5012=12 µm; T5013=27.5 µm: T505=265 µm: and T506=115 µm. To be noted, the thickness T505 of the insulating layer 135D includes a thickness of 15 µm of an adhesive between the insulating layer 135D and the base layer 1011. In addition, the thickness T506 of the conductive member 136D includes a thickness of 15 µm of an adhesive between the conductive member 136D and the insulating layer 135D. The relative permittivity of the base layer 1011 was set to 3.3, the relative permittivity of the cover layer 1013 was set to 3.6, the relative permittivity of the insulating layer 135D of was set to 4.7, and the relative permittivity of the adhesive was set to 4.0. The conductivity of the signal line 110D and the conductivity of the conductive member 136D were set to $1.724 \times 10^{-8}$ Ωm.

The width of the wiring portion 102D is denoted by W502, and the width of the pad 104D is denoted by W504. In addition, the distance between a pair of the wiring portions 102D in the differential line pair 111D is denoted by S502, and the distance between a pair of the pads 104D in the differential line pair 111D is denoted by S504. In the simulation, the values of the widths and the distances were as follows: W502=150 µm; S502=45 µm; W504=250 µm; and S504=150 µm. As described above, in Example 5, W504>W502 and S504>S502 hold.

In Example 5, the characteristic impedance (differential impedance) Z1D of the wiring portion 102D was 103.8Ω.

The characteristic impedance (differential impedance) Z3D of the pad 104D was 102.2Ω.

In Comparative Example 1, the difference (Z3X-Z2X) in the characteristic impedance was 32.7Ω. In addition, in Comparative Example 1 the difference (Z2X-Z1X) in the characteristic impedance was −18.3Ω. In contrast, in Example 5, the difference (Z3D-Z1D) in the characteristic impedance was −1.6Ω. Therefore, the absolute value |Z3D-Z1D| of the difference in the characteristic impedance of Example 5 was smaller than the absolute values |Z3X-Z2X| and |Z2X-Z1X| of the difference in the characteristic impedance of Comparative Example 1, which indicates that the characteristic impedance was more consistent in Example 5 than in Comparative Example 1. Therefore, in Example 5, generation of the reflection wave can be reduced.

As described above, according to the present disclosure, the quality of the digital signal that is transmitted is improved.

The present invention is not limited to the embodiments described above, and can be modified in many ways within the technical concept of the present disclosure. In addition, the effects described in the embodiments are merely enumeration of the most preferable effects that can be achieved by the present invention, and the effects of the present invention are not limited to those described in the embodiments.

Although the digital signal D2 is a 4-level signal in the first to fifth embodiments, the configuration is not limited to this. In addition, a configuration in which the image signal transmitted from the image sensor 202 to the image processing device 302 as the digital signal D1 that is a binary signal is not transmitted through the conversion circuits 203 and 204 may be employed. In the case of transmitting a binary signal, the conversion circuits 203 and 204 can be omitted. Even in these cases, the present disclosure is applicable when the digital signals D1 and D2 are transmitted at a high speed.

Although a case where the electronic unit of the present disclosure is applied to an image pickup apparatus such as a digital camera has been described in the first to fifth embodiments, the configuration is not limited to this. For example, the electronic unit of the present disclosure is applicable to electronic devices capable of incorporating the electronic unit, such as mobile communication devices, wearable devices, and image forming apparatuses. Examples of the mobile communication devices include devices such as smartphone, tablet PCs, and gaming devices. Examples of the image forming apparatuses include printers, copiers, facsimile machines, and multifunctional apparatuses having functions of these.

In addition, although a case where the first electronic module is configured to transmit a digital signal to the second electronic module via the transmission module has been described in the first to fifth embodiments, the configuration is not limited to this. Further, the second electronic module may be configured to transmit a digital signal to the first electronic module via the transmission module.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-178495, filed Nov. 1, 2021, which is hereby incorporated by reference herein in its entirety.

What is claimed is:

1. A transmission module comprising: a flexible printed wiring board including one or more signal lines; a connector mounted on the flexible printed wiring board; and a reinforcing member disposed at a position opposing the connector with the flexible printed wiring board therebetween, wherein the one or more signal lines each include a pad connected to a terminal of the connector, the reinforcing member includes a first portion disposed in a region including at least part of the pad as viewed in a direction perpendicular to a main surface of the flexible printed wiring board, and a second portion disposed around the first portion as viewed in the direction perpendicular to the main surface, and a member constituting the first portion is a member having a nature that reduces a characteristic impedance of the pad more than a member constituting the second portion does, wherein the one or more signal lines each include a first wiring portion that does not overlap the reinforcing member as viewed in the direction perpendicular to the main surface, and a second wiring portion that overlaps the second portion of the reinforcing member as viewed in the direction perpendicular to the main surface.

2. The transmission module according to claim 1, wherein the first portion includes a conductive member.

3. The transmission module according to claim 1,
wherein the first portion includes a first insulating member, and
the second portion includes a second insulating member.

4. The transmission module according to claim 3, wherein a relative permittivity of the first insulating member is higher than a relative permittivity of the second insulating member.

5. The transmission module according to claim 1, wherein a relative permittivity of the first insulating member is equal to a relative permittivity of the second insulating member.

6. The transmission module according to claim 1, wherein a width of the pad is larger than a width of the first wiring portion.

7. The transmission module according to claim 1, wherein a width of the pad is larger than a width of the second wiring portion.

8. The transmission module according to claim 1, wherein a width of the second wiring portion is equal to or smaller than a width of the first wiring portion.

9. The transmission module according to claim 1, wherein the one or more signal lines are a plurality of signal lines, and the plurality of signal lines include a pair of adjacent signal lines used for transmission of a differential signal.

10. The transmission module according to claim 1,
wherein the one or more signal lines are a plurality of signal lines, and the plurality of signal lines include a pair of adjacent signal lines used for transmission of a differential signal, and
a distance between a pair of the pads of the pair of adjacent signal lines is larger than a distance between a pair of the first wiring portions of the pair of adjacent signal lines.

11. The transmission module according to claim 1,
wherein the one or more signal lines are a plurality of signal lines, and the plurality of signal lines include a pair of adjacent signal lines used for transmission of a differential signal, and
a distance between a pair of the pads of the pair of adjacent signal lines is larger than a distance between a pair of the second wiring portions of the pair of adjacent signal lines.

12. The transmission module according to claim 11, wherein the distance between the pair of the second wiring portions is equal to or larger than a distance between a pair of the first wiring portions of the pair of adjacent signal lines.

13. An electronic unit comprising:
the transmission module according to claim 1;
a first electronic module; and
a second electronic module,
wherein the first electronic module transmits a digital signal to the second electronic module via the transmission module.

14. The electronic unit according to claim 13, wherein the first electronic module transmits the digital signal by multilevel transmission of three or more levels.

15. The electronic unit according to claim 14, wherein the multilevel transmission is 4-level transmission.

16. The electronic unit according to claim 13, wherein the digital signal is transmitted at a transmission speed of 10 Gbps or higher.

17. An electronic device comprising:
a casing; and
the electronic unit according to claim 13 disposed inside the casing.

* * * * *